(12) United States Patent
Okazaki et al.

(10) Patent No.: US 11,392,004 B2
(45) Date of Patent: Jul. 19, 2022

(54) DISPLAY DEVICE AND METHOD FOR MANUFACTURING THE DISPLAY DEVICE

(71) Applicant: Semiconductor Energy Laboratory Co., Ltd., Atsugi (JP)

(72) Inventors: Kenichi Okazaki, Tochigi (JP); Yukinori Shima, Tatebayashi (JP); Daisuke Kurosaki, Utsunomiya (JP); Masataka Nakada, Tochigi (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 17/291,663

(22) PCT Filed: Nov. 25, 2019

(86) PCT No.: PCT/IB2019/060103
§ 371 (c)(1),
(2) Date: May 6, 2021

(87) PCT Pub. No.: WO2020/115603
PCT Pub. Date: Jun. 11, 2020

(65) Prior Publication Data
US 2022/0004070 A1 Jan. 6, 2022

(30) Foreign Application Priority Data

Dec. 6, 2018 (JP) .............................. JP2018-229400

(51) Int. Cl.
*G02F 1/1362* (2006.01)
*G02F 1/1368* (2006.01)

(52) U.S. Cl.
CPC ...... *G02F 1/136286* (2013.01); *G02F 1/1368* (2013.01)

(58) Field of Classification Search
CPC ................................................... G02F 1/1368
See application file for complete search history.

(56) References Cited

U.S. PATENT DOCUMENTS 7,425,999 B2  9/2008  Zhang et al.
7,609,348 B2  10/2009  Nakayama et al.
(Continued)

FOREIGN PATENT DOCUMENTS

CN  107275337 A  10/2017
JP  2008-096708 A  4/2008
(Continued)

OTHER PUBLICATIONS

International Search Report (Application No. PCT/IB2019/060103) dated Mar. 3, 2020.
(Continued)

*Primary Examiner* — Sang V Nguyen
(74) *Attorney, Agent, or Firm* — Robinson Intellectual Property Law Office; Eric J. Robinson

(57) ABSTRACT

The manufacturing yield of a display device is improved. The resistance of a display device to ESD is increased. The display device includes a substrate, a display portion, a connection terminal, a first wiring, and a second wiring. The first wiring is electrically connected to the connection terminal and includes a portion positioned between the connection terminal and the display portion. The second wiring is electrically connected to the connection terminal, is positioned between the connection terminal and an end portion of the substrate, and includes a portion in which a side surface is exposed at an end portion of the substrate. The display portion includes a transistor. The transistor includes a semiconductor layer, a gate insulating layer, and a gate electrode. The semiconductor layer and the second wiring include a metal oxide.

15 Claims, 21 Drawing Sheets

(56) References Cited

U.S. PATENT DOCUMENTS

| | | |
|---|---|---|
| 9,401,354 B1 * | 7/2016 | Bae .................... H01L 27/0296 |
| 10,396,141 B2 | 8/2019 | Kawata |
| 10,482,837 B2 | 11/2019 | Kawabuchi et al. |
| 10,608,073 B2 | 3/2020 | Kawata |
| 10,892,315 B2 | 1/2021 | Kawata |
| 2008/0088784 A1 * | 4/2008 | Nakayama .......... G02F 1/13452 |
| | | 349/138 |
| 2017/0288005 A1 * | 10/2017 | Kawata ................... H01L 27/12 |
| 2018/0158427 A1 * | 6/2018 | Kawabuchi ....... G02F 1/136286 |
| 2021/0057509 A1 | 2/2021 | Sakamoto et al. |
| 2021/0091166 A1 | 3/2021 | Kawata |

FOREIGN PATENT DOCUMENTS

| | | |
|---|---|---|
| JP | 2014-007399 A | 1/2014 |
| JP | 2017-187580 A | 10/2017 |
| KR | 2016-0122901 A | 10/2016 |
| WO | WO-2019/186845 | 10/2019 |

OTHER PUBLICATIONS

Written Opinion (Application No. PCT/IB2019/060103) dated Mar. 3, 2020.

* cited by examiner

9100

9200

9101

9201

9102

9201

9201

DISPLAY DEVICE AND METHOD FOR MANUFACTURING THE DISPLAY DEVICE

TECHNICAL FIELD

One embodiment of the present invention relates to a display device. One embodiment of the present invention relates to a method for manufacturing a display device.

Note that one embodiment of the present invention is not limited to the above technical field. Examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a manufacturing method thereof. A semiconductor device generally means a device that can function by utilizing semiconductor characteristics.

BACKGROUND ART

Display devices using organic EL (Electro Luminescence) elements or liquid crystal elements have been known. Other examples of the display device include a light-emitting device provided with a light-emitting element such as a light-emitting diode (LED), and electronic paper performing display with an electrophoretic method or the like.

As a semiconductor material applicable to a transistor included in a pixel in a display device, an oxide semiconductor using a metal oxide has attracted attention. For example, Patent Document 1 discloses a semiconductor device that makes field-effect mobility (simply referred to as mobility or μFE in some cases) to be increased by stacking a plurality of oxide semiconductor layers, containing indium and gallium in an oxide semiconductor layer serving as a channel in the plurality of oxide semiconductor layers, and making the proportion of indium higher than the proportion of gallium.

A metal oxide that can be used for a semiconductor layer can be formed by a sputtering method or the like, and thus can be used for a semiconductor layer of a transistor included in a large display device. In addition, capital investment can be reduced because part of production equipment for transistors using polycrystalline silicon or amorphous silicon can be retrofitted and utilized. Furthermore, a transistor using a metal oxide has high field-effect mobility compared to the case of using amorphous silicon; therefore, a high-performance display device provided with a driver circuit can be achieved.

REFERENCE

Patent Document

[Patent Document 1] Japanese Published Patent Application No. 2014-7399

SUMMARY OF THE INVENTION

Problems to be Solved by the Invention

A transistor, a capacitor, or the like is sometimes broken due to overvoltage caused by electrostatic discharge (ESD) or the like in the manufacturing process of a display device. In particular, in the case where a display device is manufactured using an insulating substrate such as a large glass substrate, electric charge tends to be accumulated in a wiring or the like, leading to a reduction in yield.

An object of one embodiment of the present invention is to improve the manufacturing yield of a display device. Another object is to increase the resistance to ESD of a display device. Another object is to provide a display device having high reliability. Another object is to provide a display device having a novel structure.

Note that the description of these objects does not preclude the existence of other objects. One embodiment of the present invention does not have to achieve all these objects. Note that objects other than these can be derived from the description of the specification, the drawings, the claims, and the like.

Means for Solving the Problems

One embodiment of the present invention is a display device including a substrate, a display portion, a connection terminal, a first wiring, and a second wiring. The first wiring is electrically connected to the connection terminal and includes a portion positioned between the connection terminal and the display portion. The second wiring is electrically connected to the connection terminal, is positioned between the connection terminal and an end portion of the substrate, and includes a portion in which a side surface is exposed at an end portion of the substrate. The display portion includes a transistor. The transistor includes a semiconductor layer, a gate insulating layer, and a gate electrode. The semiconductor layer and the second wiring include a metal oxide.

In the above, the semiconductor layer and the second wiring are preferably provided on the same plane and preferably include the same metal element.

In the above, the semiconductor layer preferably includes a first region overlapping with the gate electrode and a second region not overlapping with the gate electrode. At this time, the second region and the second wiring preferably have lower resistances than the first region.

In the above, the second wiring preferably has a higher resistance than the first wiring.

In the above, a third wiring electrically connected to the transistor is preferably included. At this time, the third wiring and the first wiring are preferably provided on the same plane and preferably include the same metal element.

In the above, the connection terminal preferably includes part of the first wiring.

In the above, an FPC electrically connected to the connection terminal is preferably included. At this time, the FPC preferably includes a portion overlapping with the second wiring.

In the above, the substrate preferably includes a first portion overlapping with the first wiring and a second portion overlapping with the connection terminal and the second wiring. At this time, the first portion is preferably bent so that the first wiring is on an outer side, and the second portion preferably includes a region overlapping with the first wiring or the display portion.

Another embodiment of the present invention is a method for manufacturing a display device including the steps of forming a transistor including a semiconductor layer, a plurality of connection terminals, and a wiring electrically connecting the plurality of connection terminals over a substrate; cutting part of the substrate and part of the wiring to isolate the plurality of connection terminals electrically; and connecting an FPC to the plurality of connection terminals. Furthermore, the semiconductor layer and the wiring are preferably formed by processing the same metal oxide film.

Effect of the Invention

According to one embodiment of the present invention, the manufacturing yield of a display device can be improved. Alternatively, the resistance to ESD of a display device can be increased. Alternatively, a display device having high reliability can be provided. Alternatively, a display device having a novel structure can be provided.

Note that the description of the effects does not preclude the existence of other effects. Note that one embodiment of the present invention does not need to have all these effects. Note that effects other than these can be derived from the description of the specification, the drawings, the claims, and the like.

MODE FOR CARRYING OUT THE INVENTION

Figure 1A:
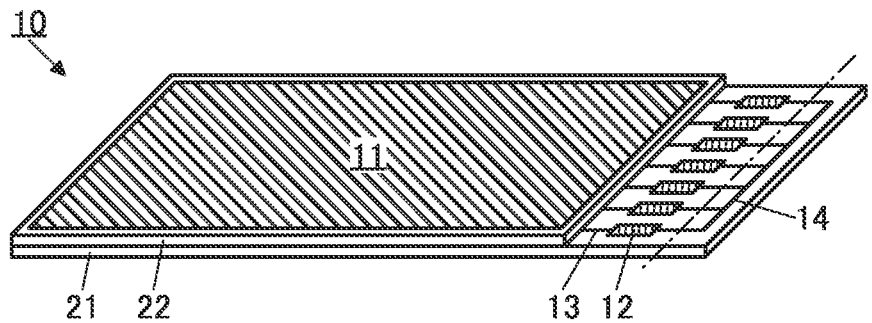
FIG. 1A to FIG. 1D are diagrams illustrating a structure example of a display device.

Hereinafter, embodiments are described with reference to the drawings. Note that the embodiments can be implemented with many different modes, and it is readily understood by those skilled in the art that modes and details thereof can be changed in various ways without departing from the spirit and scope thereof. Thus, the present invention should not be construed as being limited to the following description of the embodiments.

Note that in structures of the invention described below, the same portions or portions having similar functions are denoted by the same reference numerals in different drawings, and a description thereof is not repeated. Furthermore, the same hatch pattern is used for the portions having similar functions, and the portions are not especially denoted by reference numerals in some cases.

Note that in each drawing described in this specification, the size, the layer thickness, or the region of each component is exaggerated for clarity in some cases. Therefore, they are not limited to the illustrated scale.

Note that in this specification and the like, the ordinal numbers such as "first" and "second" are used in order to avoid confusion among components and do not limit the number.

A transistor is a kind of semiconductor elements and can achieve amplification of current or voltage, switching operation for controlling conduction or non-conduction, or the like. An IGFET (Insulated Gate Field Effect Transistor) and a thin film transistor (TFT) are in the category of a transistor in this specification.

Functions of a "source" and a "drain" are sometimes replaced with each other when a transistor of opposite polarity is used or when the direction of current is changed in circuit operation, for example. Therefore, the terms "source" and "drain" can be switched in this specification.

Moreover, in this specification and the like, the term "film" and the term "layer" can be interchanged with each other. For example, in some cases, the term "conductive layer" and the term "insulating layer" can be interchanged with the term "conductive film" and the term "insulating film," respectively.

In this specification and the like, a display panel that is one embodiment of a display device has a function of displaying (outputting) an image or the like on (to) a display surface. Thus, the display panel is one embodiment of an output device.

In this specification and the like, a substrate of a display panel to which a connector such as an FPC (Flexible Printed Circuit) or a TCP (Tape Carrier Package) is attached, or a substrate on which an IC is mounted by a COG (Chip On Glass) method or the like is referred to as a display panel module, a display module, or simply a display panel or the like in some cases.

Note that in this specification and the like, a touch panel that is one embodiment of a display device has a function of displaying an image or the like on a display surface and a function of a touch sensor capable of sensing the contact, press, approach, or the like of a sensing target such as a finger or a stylus with or to the display surface. Therefore, the touch panel is one embodiment of an input/output device.

A touch panel can also be referred to as, for example, a display panel (or a display device) with a touch sensor or a display panel (or a display device) having a touch sensor function. A touch panel can include a display panel and a touch sensor panel. Alternatively, a touch panel can have a function of a touch sensor inside a display panel or on a surface thereof.

In this specification and the like, a substrate of a touch panel on which a connector and an IC are mounted is referred to as a touch panel module, a display module, or simply a touch panel or the like in some cases.

Embodiment 1

Described in this embodiment are a structure example of a display device of one embodiment of the present invention and an example of a manufacturing method thereof.

One embodiment of the present invention is a display device in which a display portion and a plurality of connection terminals are provided over a substrate.

In the display portion, which is a region displaying an image, a plurality of pixels including display elements are arranged in a matrix. The pixel preferably includes one or more display elements and one or more transistors.

The connection terminal is a terminal to which an FPC (Flexible Printed Circuit), an IC, or the like is connected. The connection terminal is formed of at least one conductive layer and has an exposed surface.

Furthermore, a first wiring is provided between the connection terminal and the display portion. The first wiring is electrically connected to the connection terminal and has a function of supplying a signal or a potential having been supplied from the connection terminal to the display portion or a driver circuit for driving the display portion. The first wiring preferably has a low resistance. The first wiring is preferably positioned on the same plane as that of an electrode and a wiring included in the transistor and the display element, for example, and is preferably formed by processing a conductive film that is the same as the electrode and the wiring.

Furthermore, a second wiring that electrically connects a plurality of connection terminals is provided in the manufacturing process of the display device. Owing to the second wiring that electrically connects the plurality of connection terminals, an influence of ESD in the manufacturing process of the display device can be reduced, whereby an element, a wiring, or the like included in the display device can be favorably inhibited from being broken. Examples of processing that can cause ESD in the manufacturing process of the display device include a variety kinds of processing such as substrate transfer, plasma treatment in deposition, etching, or the like, wet etching treatment, development treatment, and cleaning treatment.

After formation of the display portion, the plurality of connection terminals, and the like, the second wiring and the substrate are preferably cut at the same time in the step of division (also referred to as cutting) of the substrate. Accordingly, the plurality of connection terminals can be electrically isolated at the same time in the step of division of the substrate. After that, an FPC or an IC is connected to the plurality of connection terminals, so that the display device (display module) can be completed.

The second wiring is preferably formed by processing a semiconductor film. At this time, the second wiring is preferably formed using a semiconductor film having an increased carrier concentration and a lowered resistance.

In particular, the second wiring is preferably formed using a semiconductor film that is the same as a semiconductor layer of a transistor included in the display portion or the driver circuit. The semiconductor layer of the transistor includes a channel formation region in which a channel can be formed, and low-resistance regions between which the channel formation region is provided and which have lower resistances than the channel formation region. The second wiring is preferably formed using a semiconductor film having a lowered resistance like the low-resistance regions of the semiconductor layer. The semiconductor layer may be formed using a silicon (single crystal silicon, polycrystalline silicon, or amorphous silicon) film, an organic semiconductor film, or the like; however, it is particularly preferable that the semiconductor layer be formed using a metal oxide film showing semiconductor characteristics (also referred to as an oxide semiconductor film).

After the division of the substrate, a cut surface (also referred to as an end surface or a side surface) of the second wiring is exposed near an end surface (also referred to as an end portion) of the substrate. Here, in the case where a low-resistance material such as a metal film is used for the second wiring, electrical noise might be transmitted from the exposed end portion of the second wiring to the connection terminals, or the connection terminals might be electrically short-circuited due to a contact of the cut surface of the second wiring with a housing or components included in a device on which the display device is mounted. By contrast, the problem is less likely to occur in the display device of one embodiment of the present invention since a semiconductor film having a lower conductivity than a metal film is used as the second wiring. The contact resistance at the time of being in contact with a metal member can be increased particularly when a metal oxide film is used as the second wiring as compared with the case where a metal film is used as the second wiring.

At room temperature, the electric resistivity, the resistance value per unit length of the wiring, or the sheet resistance value of the second wiring is preferably 2 times or more, further preferably 5 times or more, still further preferably 10 times or more, yet still further preferably 100 times or more, and 10000 times or less, further preferably 5000 times or less, still further preferably 1000 times or less that of the first wiring. For example, a metal oxide film in which the electric resistivity calculated from the resistance value or the sheet resistance value is greater than or equal to $1 \times 10^{-7}$ [$\Omega \cdot m$] and lower than or equal to $1 \times 10^{-3}$ [$\Omega \cdot m$], preferably greater than or equal to $1 \times 10^{-6}$ [$\Omega \cdot m$] and lower than or equal to $1 \times 10^{-4}$ [$\Omega \cdot m$] is preferably used for the second wiring.

Moreover, part of the FPC that is connected to the connection terminal is preferably provided to overlap with the second wiring remaining on the substrate side. It is particularly preferable that the part of the FPC extend to a position overlapping with the end surface of the substrate and be provided to cover the exposed end surface of the second wiring. Accordingly, the contact of the housing or the components included in the device on which the display device is mounted with the end surface of the second wiring can be favorably prevented.

Furthermore, a display device that can be bent (a flexible display) may be formed by using a flexible material for the substrate. At this time, the substrate includes a support substrate, a support film, a protective film, and the like. Moreover, when a portion of the substrate which overlaps with the first wiring (a first portion) is bent to a side opposite to the display surface side of the display portion so that the first wiring is on an outer side, a portion of the substrate which overlaps with the connection terminal and the second wiring (a second portion) can overlap with part of the first wiring or the display portion. Accordingly, the connection terminal and the FPC can be folded back to the rear side of the display surface, leading to a reduction in size of the device on which the display device is mounted.

More specific examples of the display device are described below with reference to drawings.

Structure Examples 1 of Display Device

A display device 10 illustrated in FIG. 1A includes a substrate 21, a substrate 22, a display portion 11, a plurality of connection terminals 12, a plurality of wirings 13, and a wiring 14. FIG. 1A corresponds to a perspective view before the cutting of the wiring 14.

The display portion 11 is provided in a region where the substrate 21 and the substrate 22 overlap with each other. In the display portion 11, which is a portion displaying an image, a plurality of pixels not illustrated are provided in a matrix. Note that the substrate 22 is not necessarily provided when not needed.

Examples of the display element provided in the pixel of the display portion 11 include a liquid crystal element and a light-emitting element.

Examples of the light-emitting element are self-luminous light-emitting elements such as an LED (Light Emitting Diode), an OLED (Organic LED), a QLED (Quantum-dot LED), and a semiconductor laser.

For the organic EL element (OLED), any of the following structures may be used: a bottom-emission structure in which light is emitted toward the formation surface side, a top-emission structure in which light is emitted toward the side opposite to the formation surface side, and a dual-emission structure in which light is emitted toward both sides. In particular, a light-emitting element having the top-emission structure is preferably used because the aperture ratio can be high, which facilitates an increase in definition and enables an increase in the luminance of the light-emitting element.

Examples of the light-emitting diode (LED) include a macro LED (also referred to as a huge LED), a mini LED, a micro LED, and the like in descending order in size. Here, an LED chip whose one side size is larger than 1 mm is called a macro LED, an LED chip whose one side size is larger than 100 μm and smaller than or equal to 1 mm is called a mini LED, and an LED chip whose one side size is smaller than or equal to 100 μm is called a micro LED. In particular, a mini LED or a micro LED is preferably used as the LED chip that is applied to the display portion 11. The use of a micro LED can achieve an extremely high-definition display device.

As the display element, a liquid crystal element such as a transmissive liquid crystal element, a reflective liquid crystal element, or a transflective liquid crystal element can also be used. It is also possible to use a MEMS (Micro Electro Mechanical Systems) shutter element, an optical interference type MEMS element, or a display element using a microcapsule method, an electrophoretic method, an electrowetting method, an Electronic Liquid Powder (registered trademark) method, or the like, for instance.

The connection terminals 12, the wirings 13, and the wiring 14 are provided over the substrate 21. The connection terminals 12 function as terminals electrically connected to an FPC 16 and an IC 19, which are described later, and the like. The connection terminals 12 are provided over a region of the substrate 21 which is not covered with the substrate 22.

The wirings 13 electrically connect the connection terminals 12 to the display portion 11 of the display device 10, the driver circuit (not illustrated), or the like.

The wiring 14 has a function of electrically connecting the plurality of connection terminals 12. The wiring 14 preferably has a shape that allows the plurality of connection terminals 12 to be electrically isolated from each other easily by one cutting step. For example, as illustrated in FIG. 1A, the wiring 14 preferably has a comb-like shape including a plurality of portions extended from the respective connection terminals 12 and a portion in which the plurality of portions are connected to each other. At this time, the portions of the wiring 14 that are extended from the connection terminals 12 are preferably provided to intersect with a scribe line (denoted by a dashed-dotted line) of the substrate 21, in which case the wiring 14 can be cut concurrently in the dividing step of the substrate 21.

Figure 1B:
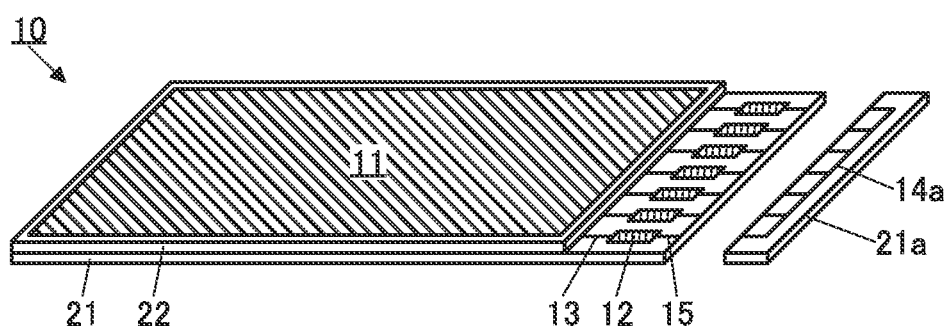

FIG. 1B is a perspective view after the cutting of the substrate 21 and the wiring 14. FIG. 1B shows a substrate 21a that is separated from the substrate 21 and a wiring 14a after the cutting.

For the cutting of the substrate 21, a scriber, a laser scriber, a cutter, a shearing device, or the like can be used. In the case where a flexible film or the like is used for the substrate 21, a cutter, a laser cutter, a lever shear, a punching apparatus, or the like may be used. Examples of the punching apparatus include an apparatus using a mold and an apparatus using a Thomson form (a wooden form in which a steel cutter is embedded).

When the wiring 14 is cut at the same time as the division of the substrate 21, a plurality of wirings 15 are formed and the plurality of connection terminals 12 are electrically isolated from each other on the substrate 21 side. One wiring 15 is electrically connected to one connection terminal 12. Furthermore, a cut surface (also referred to as a side surface and an end surface) of an end portion of the wiring 15 that is on a side opposite to the connection terminal 12 is exposed at an end portion of the substrate 21.

Figure 1C:
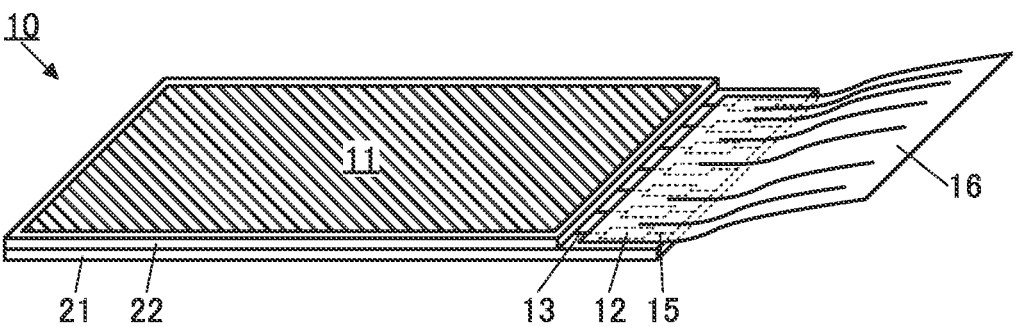

FIG. 1C corresponds to a perspective view after the FPC 16 is attached to the plurality of connection terminals 12. Note that an IC may be attached separately from the FPC 16, or an FPC on which an IC is mounted may be attached to the connection terminals 12.

Figure 1D:
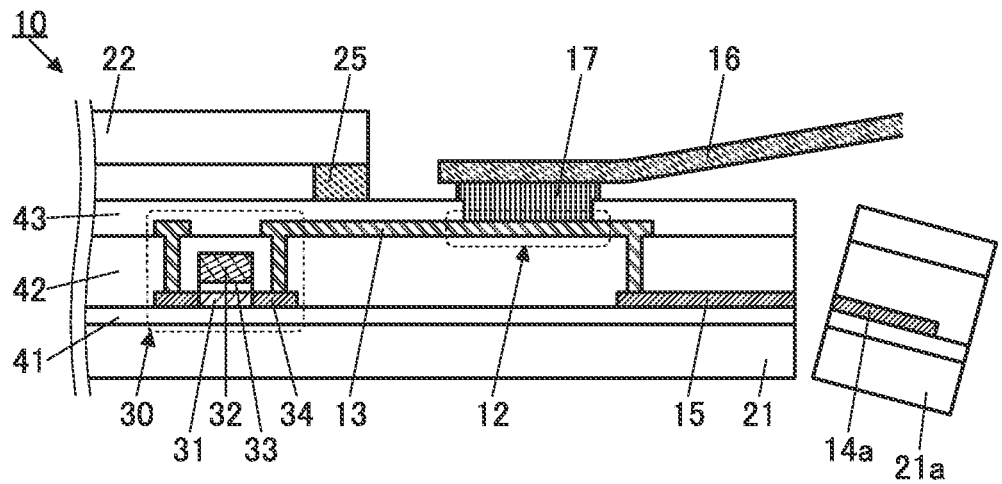

FIG. 1D is a schematic cross-sectional view of a cut surface of the substrate 21 of the display device 10 and the vicinity thereof. FIG. 1D also clearly shows the substrate 21a and the wiring 14a that have been cut.

The display device 10 includes a transistor 30, the wiring 13, the connection terminal 12, the wiring 15, and the like between the substrate 21 and the substrate 22. Furthermore, the substrate 21 and the substrate 22 are attached to each other with the bonding layer 25. The transistor 30 is a transistor included in a pixel of the display portion 11 or a transistor included in a driver circuit for driving the display portion 11.

The transistor 30 is provided over an insulating layer 41 that is over the substrate 21 and includes a semiconductor layer 31, a conductive layer 32, and an insulating layer 33. Part of the conductive layer 32 functions as a gate electrode. Part of the insulating layer 33 functions as a gate insulating layer. A region of the semiconductor layer 31 overlapping with the conductive layer 32 functions as a channel formation region. Furthermore, in the semiconductor layer 31, a pair of low-resistance regions 34 is provided with the channel formation region provided therebetween.

For the semiconductor layer 31, a metal oxide exhibiting semiconductor characteristics (an oxide semiconductor) is preferably used. Although silicon, an organic semiconductor, or the like may be used for the semiconductor layer 31, when an oxide semiconductor is used, a high performance display device can be manufactured at low cost as compared with the case where silicon, an organic semiconductor, or the like is used.

The pair of low-resistance regions 34 functions as a source region and a drain region of the transistor 30. The low-resistance regions 34 are regions having lower resistances than the channel formation region. The low-resistance regions 34 can also be referred to as regions having a higher carrier concentration, regions having a larger number of oxygen vacancies, regions having a higher hydrogen concentration, or regions having a higher impurity concentration than the channel formation region.

Furthermore, an insulating layer 42 is provided to cover the transistor 30, and the wiring 13 is provided over the insulating layer 42. FIG. 1D shows an example in which the wiring 13 is electrically connected to the low-resistance regions 34 of the transistor 30 in an opening provided in the insulating layer 42. An insulating layer 43 is provided to cover the wiring 13.

FIG. 1D shows an example in which part of the wiring 13 is included in the connection terminal 12. In the connection terminal 12, part of the insulating layer 43 that is over the wiring 13 is removed. Note that the example in which the wiring 13 is electrically connected to one of the source and the drain of the transistor 30 is shown here; however, the wiring 13 may be electrically connected to a gate of the transistor 30.

Furthermore, the wiring 15 is provided at the end portion of the substrate 21. The wiring 15 is provided on the same plane as that of the semiconductor layer 31 (that is, over the insulating layer 41). The wiring 15 and the semiconductor layer 31 are preferably formed by processing the same semiconductor film. The wiring 15 preferably has a lower resistance than the channel formation region like the low-resistance regions 34 of the semiconductor layer 31. Furthermore, the wiring 15 preferably has a higher resistance than the wiring 13.

Furthermore, the cut surface (also referred to as the end surface and the side surface) of the wiring 15 is exposed near the end surface (end portion) of the substrate 21. FIG. 1D shows an example in which the side surface of the substrate 21, a side surface of the insulating layer 41, the side surface of the wiring 15, a side surface of the insulating layer 42, and a side surface of the insulating layer 43 are aligned. Note that sometimes these side surfaces (end surfaces) are not aligned in the case where each insulating layer and the wiring 15 are contracted or extended in the film surface direction depending on stress relaxation at the time of cutting the substrate 21a. For example, the end surface of the wiring 15 is positioned inward or projects outward from the end surface of the substrate 21 in some cases.

Note that in this specification and the like, the expression "an end portion of a substrate" refers to a region including a range from the end surface of the substrate to a region 10 mm inward from the end surface, a region including a range from the end surface of the substrate to a region 5 mm inward from the end surface, or a region including a range from the end surface of the substrate to a region 3 mm inward from the end surface, and a region overlapping with any of the regions of the substrate. Furthermore, the expression "an end surface of a substrate" also includes the end surface of the substrate.

The FPC 16 is connected to the connection terminal 12 though a connector 17. The FPC 16 includes a region overlapping with the wiring 15. Furthermore, the FPC 16 also overlaps with the end surface of the substrate 21 and the end surface of the wiring 15 and is provided to cover them. Thus, even when the end surface of the wiring 15 is exposed, the end surface of the wiring 15 is protected by part of the FPC 16, and thus electrical short-circuit of the plurality of wirings 15 due to contact with a conductive component can be favorably prevented. Moreover, with the structure in which the end surface of the wiring 15 is covered with the FPC 16, electrical noise that can be input to the wiring 15 from the outside can be blocked or reduced by the FPC 16 in some cases.

Although the example in which the wiring 14 is cut at the same time as the cutting of the substrate 21 is described above, the wiring 14 may be cut in a step different from the cutting of the substrate 21. In that case, the end surface of the wiring 15 is positioned inward from the end surface of the substrate 21 and the surface is not exposed in some cases.

Figure 2A:
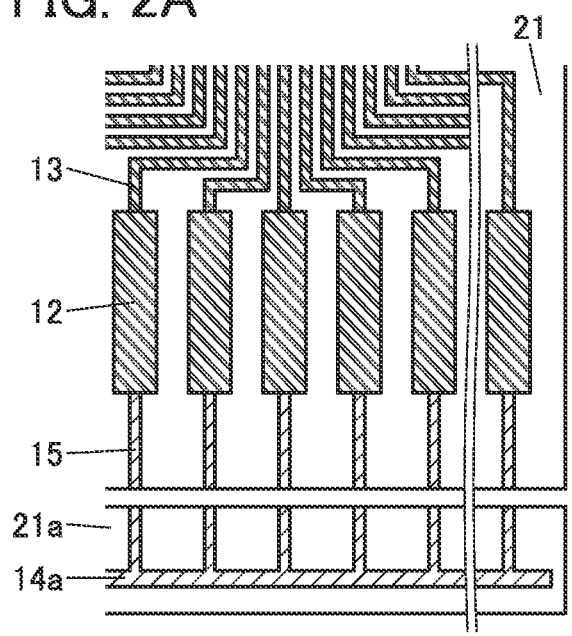
FIG. 2A to FIG. 2D are diagrams illustrating structure examples of a display device.

The top surface shapes of the wiring 15 and the like are described below. FIG. 2A is a schematic top view of the connection terminals 12 and the vicinity of the end portion of the substrate 21. Furthermore, FIG. 2A also clearly shows the substrate 21a that has been divided and the wiring 14a that has been cut.

As illustrated in FIG. 2A, the wiring 15 is provided to extend from the connection terminal 12 to the cut surface (end surface) of the substrate 21.

Figure 2B:
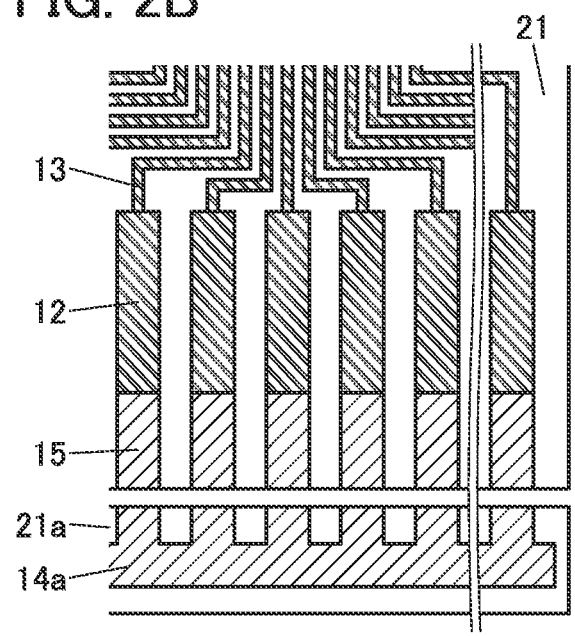

FIG. 2A shows an example in which the width of the wiring 15 is smaller than that of the connection terminal 12. Furthermore, FIG. 2B shows an example in which the width of the wiring 15 is made substantially the same as that of the connection terminal 12. Although not shown here, the width of the wiring 15 may be larger than that of the connection terminal 12. When the width of the wiring 15 is larger, the electric resistance can be smaller. The width of the wiring 15 can be selected in accordance with the value of the required wiring resistance.

Figure 2C:
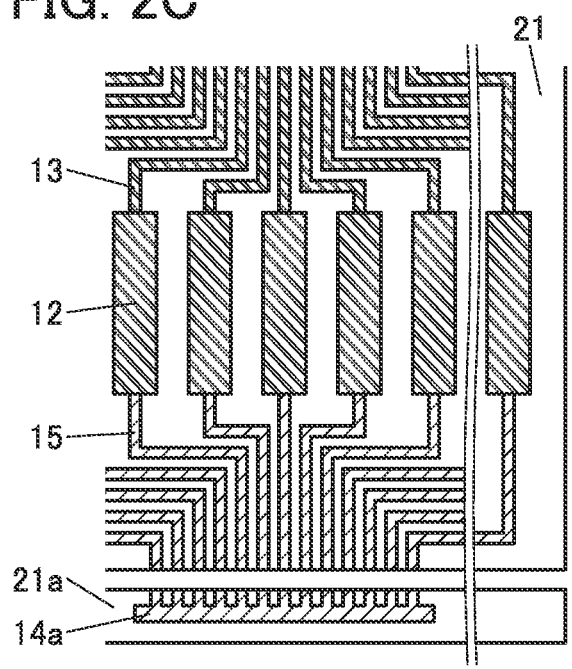

Furthermore, FIG. 2C shows an example in which the arrangement interval between the wirings 15 at the end portion of the substrate 21 is narrower than the arrangement interval between the connection terminals 12. Accordingly, the width of a portion of the wiring 14 to be cut can be small in the step of dividing the substrate 21; thus, the yield in the step can be increased.

Figure 2D:
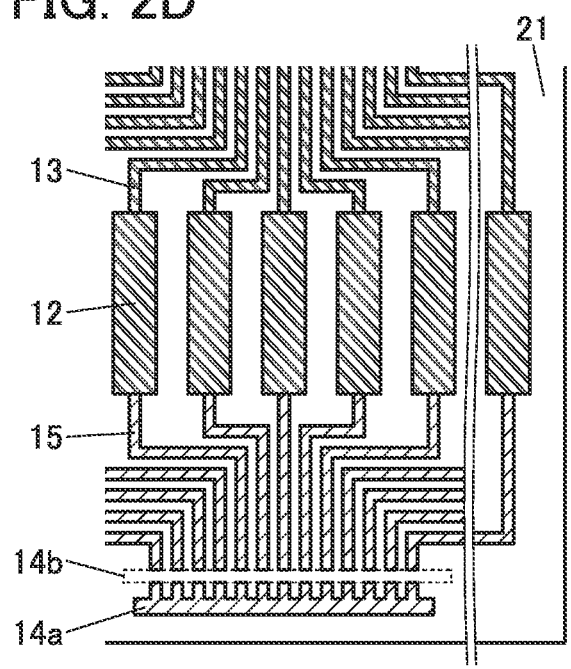

FIG. 2D shows an example in which the substrate 21 is not cut and only the wiring 14 is cut. For example, the wiring 14 is cut with a laser processing machine, a cutter, or the like or part of the wiring 14 is removed by etching, so that only the wiring 14 can be cut without the substrate 21 being cut, and the plurality of connection terminals 12 can be electrically isolated.

Furthermore, in FIG. 2D, a processing trace 14b that is generated at the time of cutting the wiring 14 is shown by a dashed line. The shape of the processing trace 14b is changed depending on the cutting method of the wiring 14. For example, in the case where the wiring 14 is cut with a laser processing machine, a cutter, or the like, an insulating film provided over or below the wiring 14, a flaw, a depression and a projection, an opening portion, or the like that remains on the substrate 21 or the like corresponds to the processing trace 14b. In the case where the wiring 14 is cut by etching, an opening portion provided in an insulating film or the like that covers the wiring 14 corresponds to the processing trace 14b.

Here, when a plurality of display devices are manufactured using a large substrate, the cutting step of the wiring 14 preferably serves also as the step of dividing the substrate for the respective display devices. Accordingly, the productivity can be increased.

Figure 3:
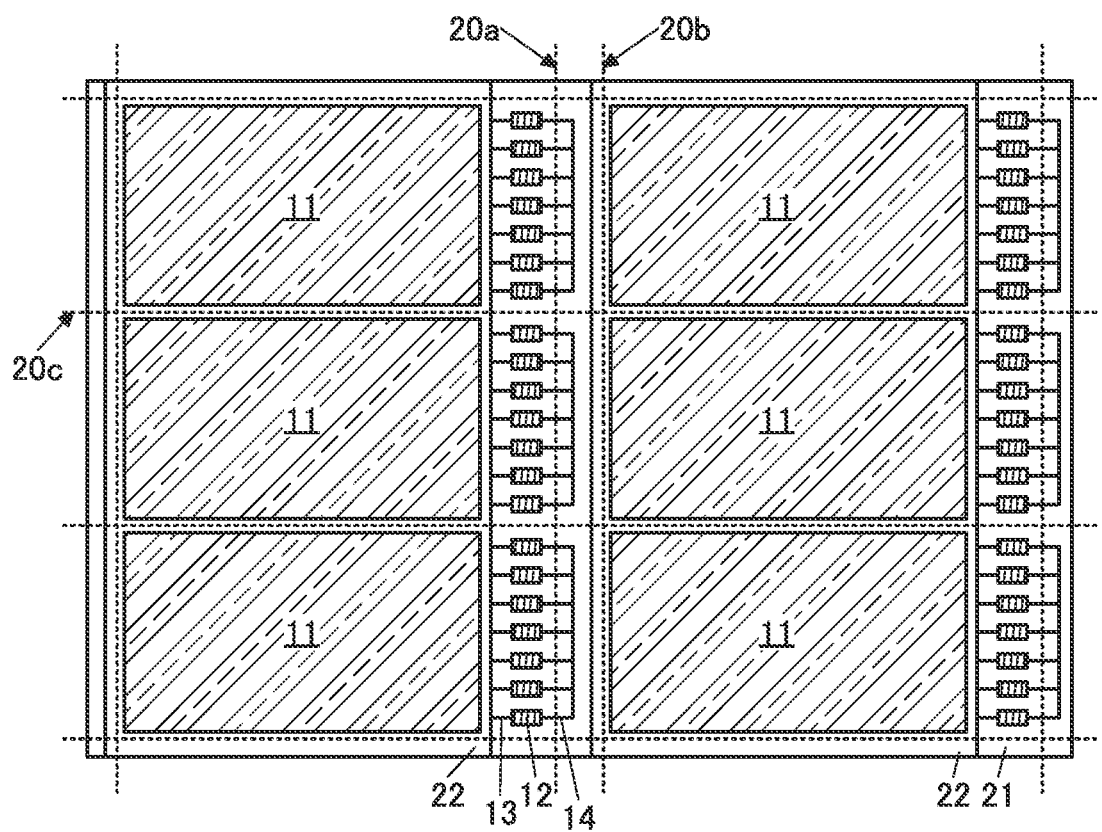
FIG. 3 is a diagram illustrating a structure example of a display device.

FIG. 3 shows the substrate 21 and the like before the division as an example. Here, an example in which 3 (in the longitudinal direction)×2 (in the lateral direction) display devices (in total, six display devices) are formed over one substrate 21 is shown. Furthermore, in FIG. 3, a plurality of cut lines 20a to 20c are shown by dashed lines.

FIG. 3 shows an example in which the belt-shaped substrate 22 is provided for a plurality of display devices arranged in the longitudinal direction. In FIG. 3, the connection terminals 12, part of the wirings 13, and the wiring 14 are provided in a region of the substrate 21 that is not covered with the substrate 22.

The cut line 20b is a cut line that separates two display devices adjacent in the lateral direction. The cut line 20c is a cut line that separates two display devices adjacent in the longitudinal direction. The cut line 20a is a cut line that is parallel to the cut line 20b and divides the substrate 21 and the wiring 14.

Cross-Sectional Structure Examples 1

A more specific cross-sectional structure example of the display device 10 is described below.

Structure Example 1

Figure 4A:
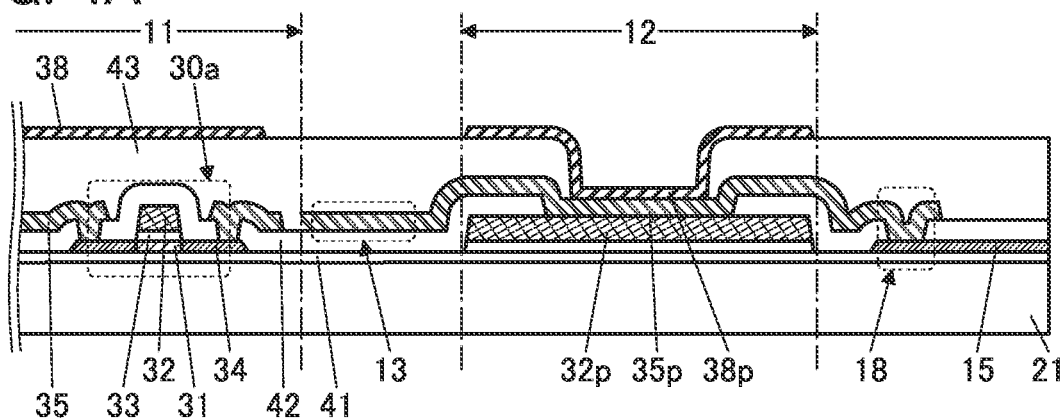
FIG. 4A and FIG. 4B are diagrams illustrating cross-sectional structure examples of a display device.

FIG. 4A shows an example of a cross-sectional view of the display device 10. FIG. 4A shows an example of a cross-sectional view in a region including the end portion of the substrate 21, the wiring 15, the connection terminal 12, the wiring 13, and a transistor 30a provided in the display portion 11.

Note that a display element in the display portion 11, the substrate 22, and the like are not clearly shown here for simple description.

The transistor 30a includes the semiconductor layer 31 provided over the insulating layer 41, the insulating layer 33 over the semiconductor layer 31, and the conductive layer 32 that is over the insulating layer 33 and overlaps with the channel formation region of the semiconductor layer 31. The semiconductor layer 31 includes the pair of low-resistance regions 34 between which the channel formation region is positioned. Part of the conductive layer 32 functions as a gate electrode and part of the insulating layer 33 functions as a gate insulating layer.

The transistor 30a is what is called a top-gate transistor, in which the gate electrode is included over the semiconductor layer 31.

Furthermore, the insulating layer 33 is processed so that the top surface shape of the insulating layer 33 is substantially the same as that of the conductive layer 32. The insulating layer 42 is provided to cover the transistor 30a and is provided in contact with the top surfaces of the low-resistance regions 34 of the semiconductor layer 31. A pair of conductive layers 35 functioning as a source electrode and a drain electrode is provided over the insulating layer 41. The conductive layers 35 are electrically connected to the low-resistance regions 34 through openings provided in the insulating layer 42.

Note that in this specification and the like, the expression "having substantially the same top surface shapes" means that at least outlines of stacked layers partly overlap with each other. For example, the case of processing an upper layer and a lower layer with the use of the same mask pattern or mask patterns that are partly the same is included. However, in some cases, the outlines do not completely overlap with each other and the upper layer is positioned on an inner side of the lower layer or the upper layer is positioned on an outer side of the lower layer; such a case is also represented by the expression "the top-view shapes are substantially the same."

The wiring 13 that is electrically connected to the connection terminal 12 is positioned on the same plane as that of the pair of conductive layers 35 that is electrically connected to the transistor 30a (that is, over the insulating layer 42). Here, the wiring 13 and the conductive layers 35 are preferably formed by processing the same conductive film.

Furthermore, the insulating layer 43 is provided to cover the insulating layer 42 and the conductive layer 35. The insulating layer 43 may function as a planarization layer. A conductive layer 38 is provided over the insulating layer 43. The conductive layer 38 can be used as a pixel electrode, a wiring, or the like.

The connection terminal 12 has a stacked-layer structure in which a conductive layer 32p, a conductive layer 35p, and a conductive layer 38p are stacked.

The conductive layer 32p is positioned on the same plane as that of the conductive layer 32. In that case, the conductive layer 32p and the conductive layer 32 are preferably formed by processing the same conductive film.

The conductive layer 35p constitutes part of the wiring 13. The conductive layer 35p is electrically connected to the conductive layer 32p through an opening provided in the insulating layer 42. The conductive layer 35p is positioned on the same plane as that of the conductive layer 35. In that case, the conductive layer 35p and the conductive layer 35 are preferably formed by processing the same conductive film.

The conductive layer 38p is provided over the insulating layer 43 and is electrically connected to the conductive layer 35p through an opening provided in the insulating layer 43. The conductive layer 38p is positioned on the same plane as that of the conductive layer 38. In that case, the conductive layer 38p and the conductive layer 38 are preferably formed by processing the same conductive film.

Here, a conductive material that is not easily oxidized or a conductive material that maintains the conductivity even when oxidized is preferably used for the surface of the connection terminal 12. In particular, a conductive oxide or a conductive nitride is preferably used for the conductive layer positioned on the surface side of the connection terminal 12.

In the structure of the connection terminal 12 illustrated in FIG. 4A, the exposed surface of the conductive layer 38p corresponds to a portion connected to the FPC 16 and the like. Thus, a conductive oxide material or the like is preferably used for at least the top of the conductive layer 38p. For example, it is preferable that a stacked-layer structure including a conductive film containing a metal or an alloy and a conductive film containing a conductive oxide be used for the conductive layer 38p because the electric resistance can be reduced.

Note that the structure of the connection terminal 12 is not limited to this as long as the connection terminal 12 includes at least one of the conductive layer 32p, the conductive layer 35p, and the conductive layer 38p. In particular, the conductive layer 35p is preferably included.

The wiring 15 is provided at the end portion of the substrate 21. FIG. 4A shows an example in which the substrate 21, the insulating layer 41, the wiring 15, the insulating layer 42, and the insulating layer 43 are stacked at the end portion of the substrate 21 and these end surfaces (cut surfaces) are substantially aligned.

The wiring 15 is positioned on the same plane as that of the semiconductor layer 31 of the transistor 30a (here, over the insulating layer 41). In particular, the wiring 15 and the semiconductor layer 31 are preferably formed by processing the same film. Furthermore, the wiring 15 preferably has a low resistance, like the low-resistance regions 34 included in the semiconductor layer 31.

In FIG. 4A, a connection portion 18 for the conductive layer 35p and the wiring 15 is shown by a dashed line. Here, in the connection portion 18, the conductive layer 35p and the wiring 15 are electrically connected to each other through an opening provided in the insulating layer 42.

Structure Example 2

Figure 4B:
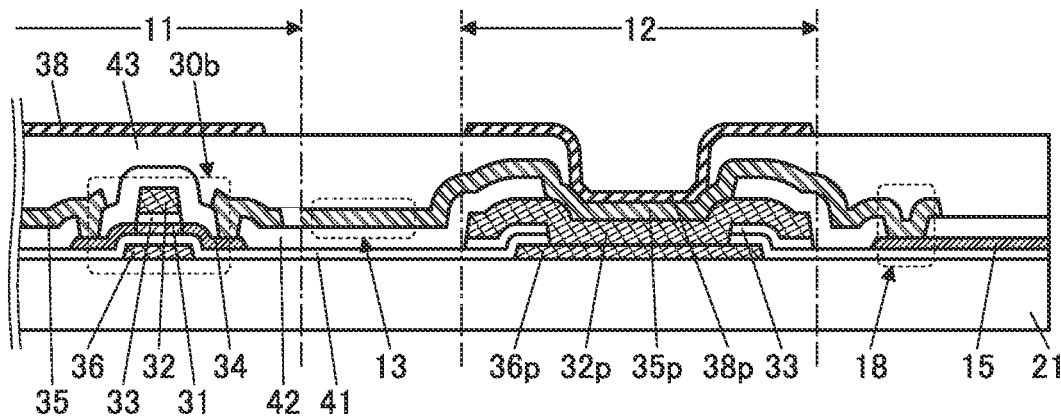

FIG. 4B differs from FIG. 4A mainly in part of the structure of the transistor and part of the structure of the connection terminal 12.

A transistor 30b illustrated in FIG. 4B includes a conductive layer 36 that is between the substrate 21 and the insulating layer 41 and overlaps with the channel formation region of the semiconductor layer 31. In the transistor 30b, the conductive layer 36 functions as a first gate electrode, and the conductive layer 32 functions as a second gate electrode. At this time, part of the insulating layer 41 functions as a first gate insulating layer, and part of the insulating layer 33 functions as a second gate insulating layer.

Different potentials or signals may be supplied to the conductive layer 32 and the conductive layer 36. Alternatively, the conductive layer 32 and the conductive layer 36 may be electrically connected to each other to be supplied with the same potential or signal. Alternatively, the conductive layer 36 may be electrically connected to one of the pair of conductive layers 35.

The connection terminal 12 includes a conductive layer 36p. The conductive layer 36p is positioned on the same plane as that of the conductive layer 36. In that case, the conductive layer 36p and the conductive layer 36 are preferably formed by processing the same conductive film.

The conductive layer 36p and the conductive layer 32p are electrically connected to each other through an opening provided in part of the insulating layer 41 and part of the insulating layer 33.

Structure Example 3

Figure 5A:
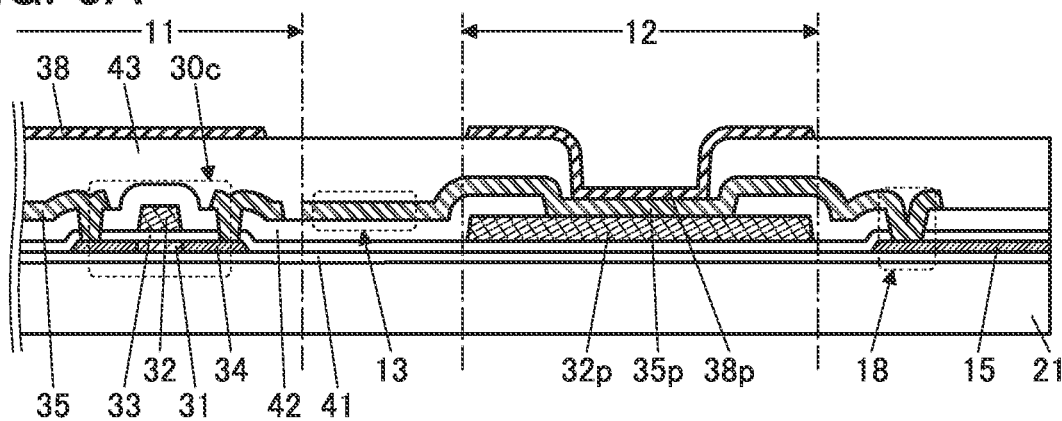
FIG. 5A and FIG. 5B are diagrams illustrating cross-sectional structure examples of a display device.

FIG. 5A differs from FIG. 4A mainly in part of the transistor structure.

In a transistor 30c illustrated in FIG. 5A, the insulating layer 33 is provided to cover a top surface and a side surface of the semiconductor layer 31 (that is, top surfaces and side surfaces of the low-resistance regions 34). Furthermore, a top surface and a side surface of the wiring 15 are also covered with the insulating layer 33.

Structure Example 4

Figure 5B:
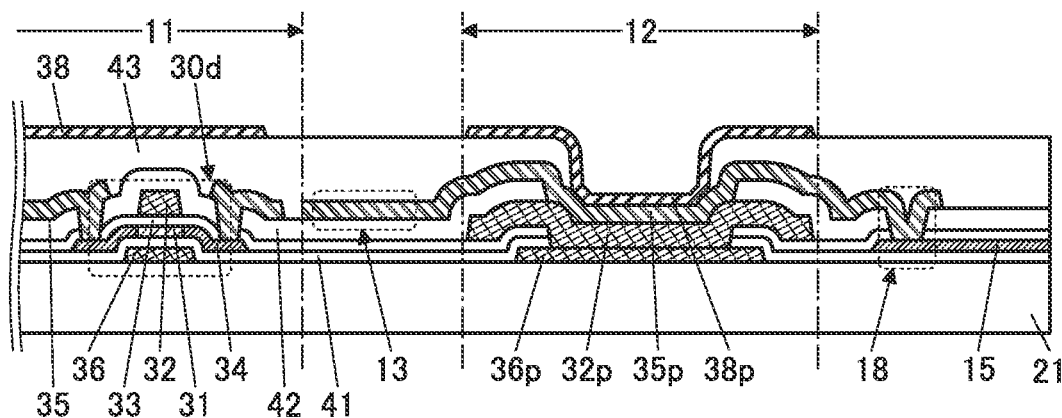

FIG. 5B differs from FIG. 4B mainly in part of the transistor structure.

In a transistor 30d illustrated in FIG. 5B, the insulating layer 33 is provided to cover a top surface and a side surface of the semiconductor layer 31 (that is, top surfaces and side surfaces of the low-resistance regions 34). Furthermore, a top surface and a side surface of the wiring 15 are also covered with the insulating layer 33.

Structure Example 5

Figure 6A:
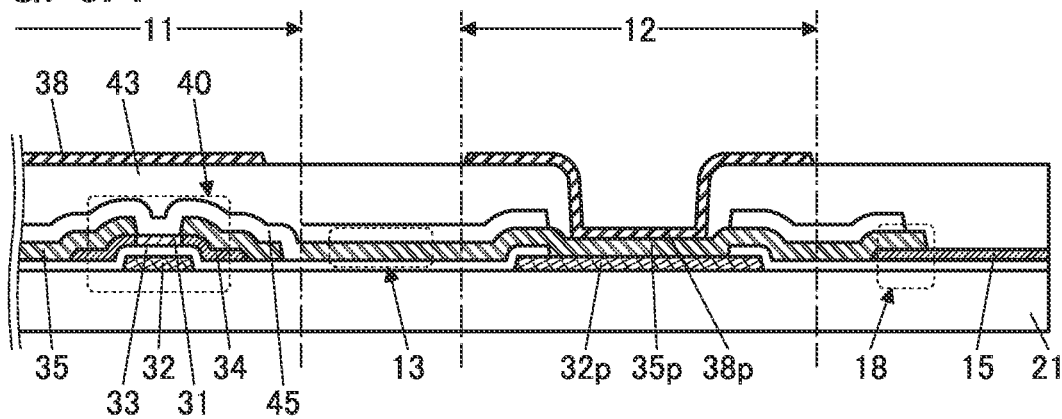
FIG. 6A and FIG. 6B are diagrams illustrating cross-sectional structure examples of a display device.

FIG. 6A is an example in which a transistor 40 having a structure different from the above is used.

The transistor 40 includes the conductive layer 32 provided over the substrate 21, the insulating layer 33 that covers the conductive layer 32, the semiconductor layer 31 that is positioned over the insulating layer 33 and includes a region overlapping with the conductive layer 32, and the pair of conductive layers 35 that is in contact with a top surface of the semiconductor layer 31.

The transistor 40 is what is called a bottom-gate transistor including a gate electrode below the semiconductor layer 31.

A region of the semiconductor layer 31 that overlaps with the conductive layer 32 and is not in contact with the conductive layers 35 functions as a channel formation region. Furthermore, regions of the semiconductor layer 31 that are in contact with the conductive layers 35 functions as the low-resistance regions 34.

Furthermore, an insulating layer 45 is provided to cover the transistor 40, and the insulating layer 43 and the conductive layer 38 are provided over the insulating layer 45. Part of the insulating layer 45 is provided in contact with the top surface of the channel formation region of the semiconductor layer 31.

The connection terminal 12 includes the conductive layer 32p, the conductive layer 35p, and the conductive layer 38p. The conductive layer 32p and the conductive layer 35p are electrically connected to each other through an opening provided in the insulating layer 33. The conductive layer 35p and the conductive layer 38p are electrically connected to each other through an opening provided in the insulating layer 45 and the insulating layer 43.

The wiring 15 is provided over the insulating layer 33. Furthermore, in the connection portion 18, the conductive layer 35p and the wiring 15 are in contact with each other and are electrically connected to each other.

Here, in the case of a structure in which the insulating layer 45 is in contact with a top surface of the wiring 15, a stacked-layer structure that is similar to that of the channel formation region of the transistor 40 is formed, leading to an increase in the resistance of the wiring 15 in some cases. Thus, the insulating layer 45 is preferably processed not to be in contact with the top surface of the wiring 15 as illustrated in FIG. 6A. FIG. 6A shows an example in which the insulating layer 43 is provided in contact with the top surface of the wiring 15.

Structure Example 6

Figure 6B:
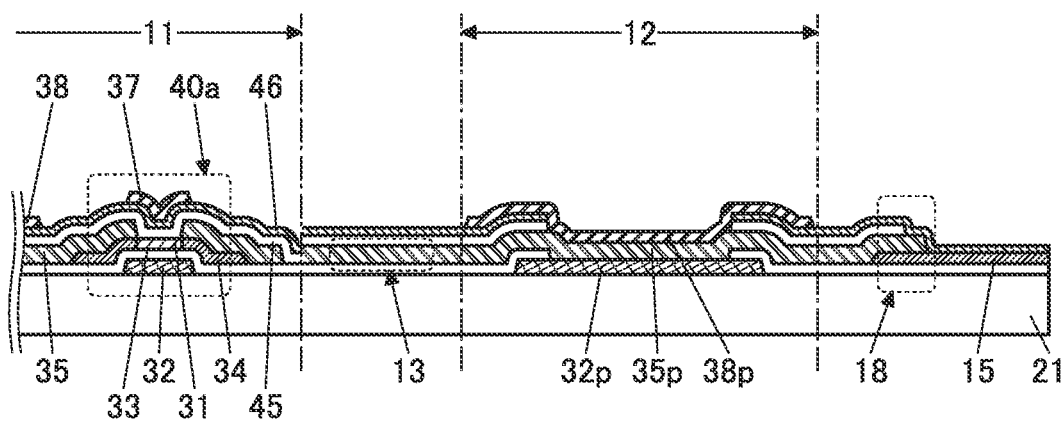

FIG. 6B differs from FIG. 6A mainly in that an insulating layer 46 is included instead of the insulating layer 43 and that a conductive layer 37 is included.

The insulating layer 46 functions as a barrier film preventing diffusion of water, hydrogen, or the like from the outside. Furthermore, the insulating layer 46 may have a function of releasing oxygen contained in the insulating layer 45 to the outside.

A transistor 40a includes the conductive layer 37 functioning as a second gate electrode. The conductive layer 37 includes a region overlapping with the channel formation region of the semiconductor layer 31 with the insulating layer 45 and the insulating layer 46 positioned therebetween. The conductive layer 37 and the conductive layer 38 are preferably formed by processing the same conductive film.

The connection terminal 12 includes the conductive layer 32p, the conductive layer 35p, and the conductive layer 38p. The conductive layer 35p and the conductive layer 38p are electrically connected to each other through an opening provided in the insulating layer 45 and the insulating layer 46.

The insulating layer 45 is processed not to be in contact with the top surface of the wiring 15. Furthermore, the insulating layer 46 is provided to extend beyond the end portion of the insulating layer 45 and be in contact with the top surface of the wiring 15.

MODIFICATION EXAMPLES

Examples in which the semiconductor layer 31 of the transistor and the wiring 15 are formed by processing different films are described below.

Modification Example 1

Figure 7A:
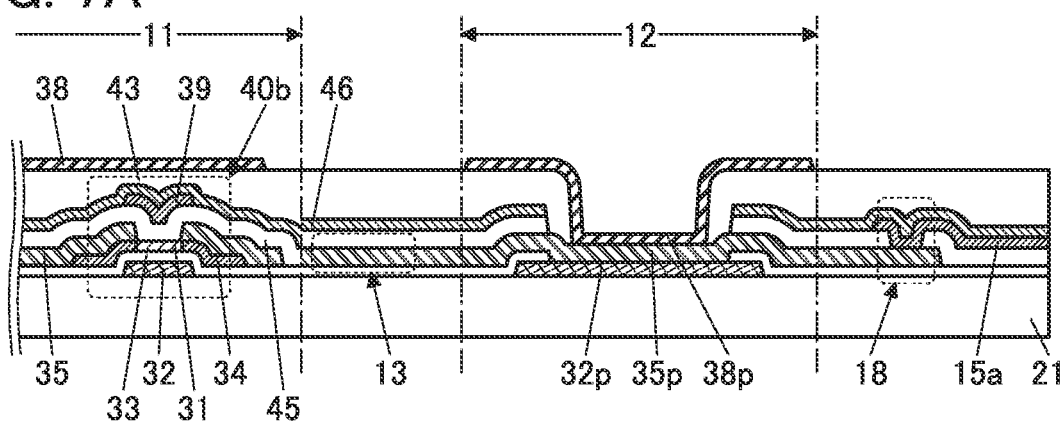
FIG. 7A and FIG. 7B are diagrams illustrating cross-sectional structure examples of a display device example.

FIG. 7A differs from the structure illustrated in FIG. 6A mainly in that a conductive layer 39 and the insulating layer 46 are included.

A transistor 40b illustrated in FIG. 7A includes the conductive layer 39 functioning as a second gate electrode. The conductive layer 39 is provided over the insulating layer 45 and includes a portion overlapping with the channel formation region of the semiconductor layer 31 with the insulating layer 45 positioned therebetween. Furthermore, the insulating layer 46 is provided in contact with a top surface and a side surface of the conductive layer 39.

The conductive layer 39 preferably contains a material similar to that of the semiconductor layer 31. In particular, the conductive layer 39 and the semiconductor layer 31 preferably contain metal oxides one or more metal elements of which are the same as each other. It is particularly preferable that the conductive layer 39 and the semiconductor layer 31 have substantially the same metal element composition (content percentage).

The connection terminal 12 includes the conductive layer 32p, the conductive layer 35p, and the conductive layer 38p. The conductive layer 35p is electrically connected to the conductive layer 38p through an opening provided in the insulating layer 45, the insulating layer 46, and the insulating layer 43.

The wiring 15a is provided at the end portion of the substrate 21. The wiring 15a is provided over the insulating layer 45. The wiring 15a and the conductive layer 39 are preferably formed by processing the same conductive film. The insulating layer 46 is provided in contact with a top surface and a side surface of the wiring 15a.

Furthermore, in the connection portion 18, the conductive layer 35p and the wiring 15a are electrically connected to each other through an opening provided in the insulating layer 45.

Modification Example 2

Figure 7B:
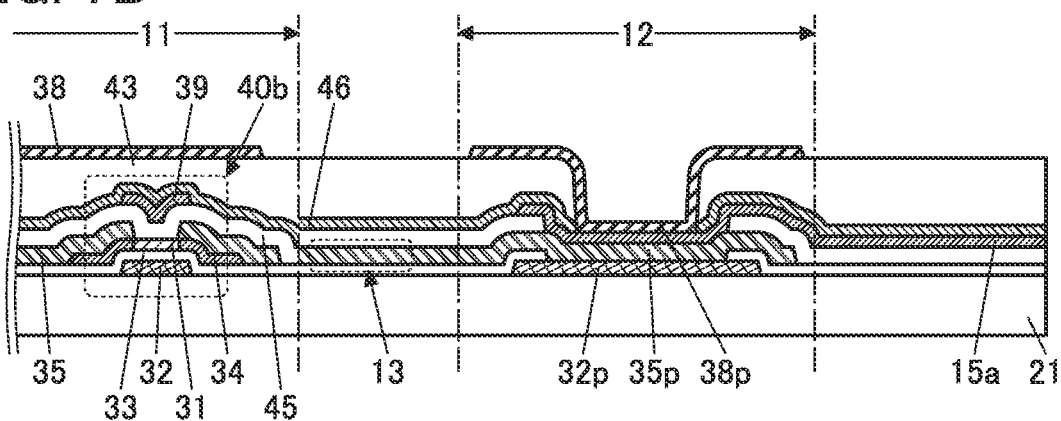

FIG. 7B shows an example in which the wiring 15a extends to the connection terminal 12.

The connection terminal 12 includes the conductive layer 32p, the conductive layer 35p, part of the wiring 15a, and the conductive layer 38p. The conductive layer 35p and the part of the wiring 15a are electrically connected to each other through an opening provided in the insulating layer 45. The wiring 15a and the conductive layer 38p are electrically connected to each other through an opening provided in the insulating layer 46 and the insulating layer 43.

With such a structure, the connection terminal 12 can also serve as the connection portion 18.

In each structure example and each modification example exemplified here, the connection terminal and the wiring electrically connected to the connection terminal can be formed using the conductive film, the semiconductor film, or the like included in the transistor or the pixel included in the display portion. Thus, the connection terminal and the wiring can be formed without an increase in steps; thus, the manufacturing cost is not increased, and the display device having high reliability can be manufactured at low cost.

Structure Examples 2 of Display Device

Structure examples of a display device that has flexibility and can be bent are described below.

Structure Example 1

Figure 8A:
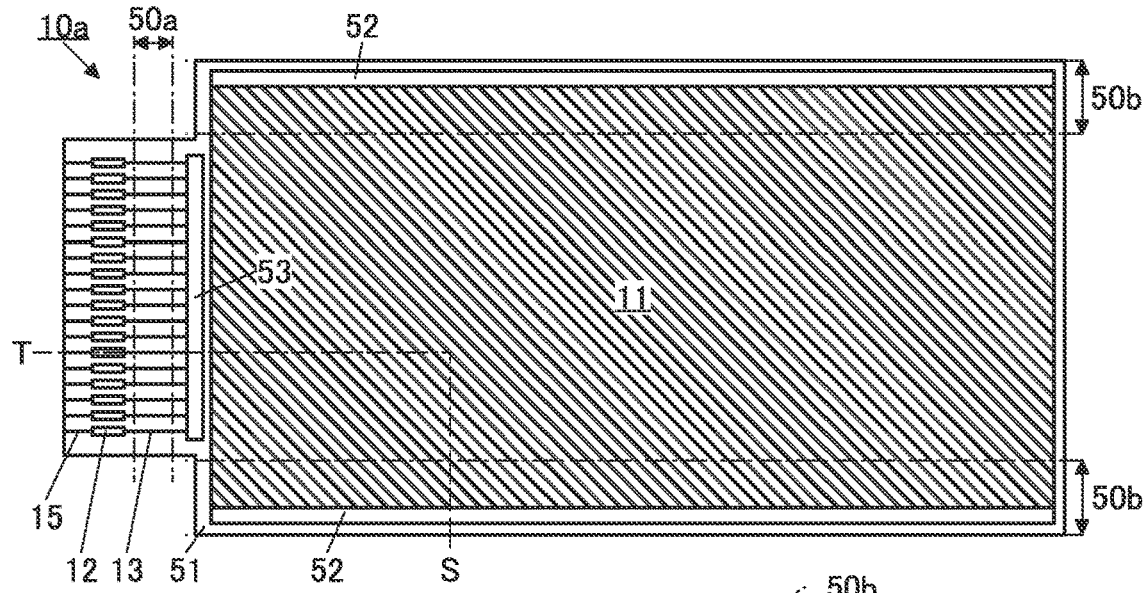
FIG. 8A to FIG. 8C are diagrams illustrating a structure example of a display device.

FIG. 8A is a schematic top view of a display device 10a. The display device 10a includes a substrate 51 having flexibility. The display portion 11, a pair of circuit portions 52, a circuit portion 53, the plurality of wirings 13, the plurality of connection terminals 12, and the plurality of wirings 15 are provided over the substrate 51.

The circuit portions 52 and the circuit portion 53 have a function of driving the display portion 11. Two circuit portions 52 are provided with the display portion 11 positioned therebetween. The circuit portion 53 is provided between the display portion 11 and the wirings 13. The circuit portions 52 function as gate drivers, for example, and the circuit portion 53 functions as a source driver or part of the source driver, for example. For example, the circuit portion 53 may include a buffer circuit or a demultiplexer circuit.

As a display element provided in the display portion 11, the above-described variety of display elements such as a liquid crystal element and a light-emitting element can be used. In particular, an organic EL element is preferably used as the display element.

In the top surface shape, a portion of the substrate 51 over which the wirings 13, the connection terminals 12, and the wirings 15 are provided projects from the other portion. In other words, the width of the portion of the substrate 51 is smaller than the width of a portion of the substrate 51 over which the display portion 11 is provided.

Furthermore, the projecting portion of the substrate 51 includes a region that can be bent (a bent portion 50a) in a region overlapping with the wirings 13. Moreover, the substrate 51 includes a pair of regions that can be bent (bent portions 50b) in a region over which the display portion 11 is provided. As illustrated in FIG. 8A, owing to the projecting shape of the part of the substrate 51, the bending direction of the bent portion 50a can intersect with the bending direction of the bent portions 50b.

Figure 8B:
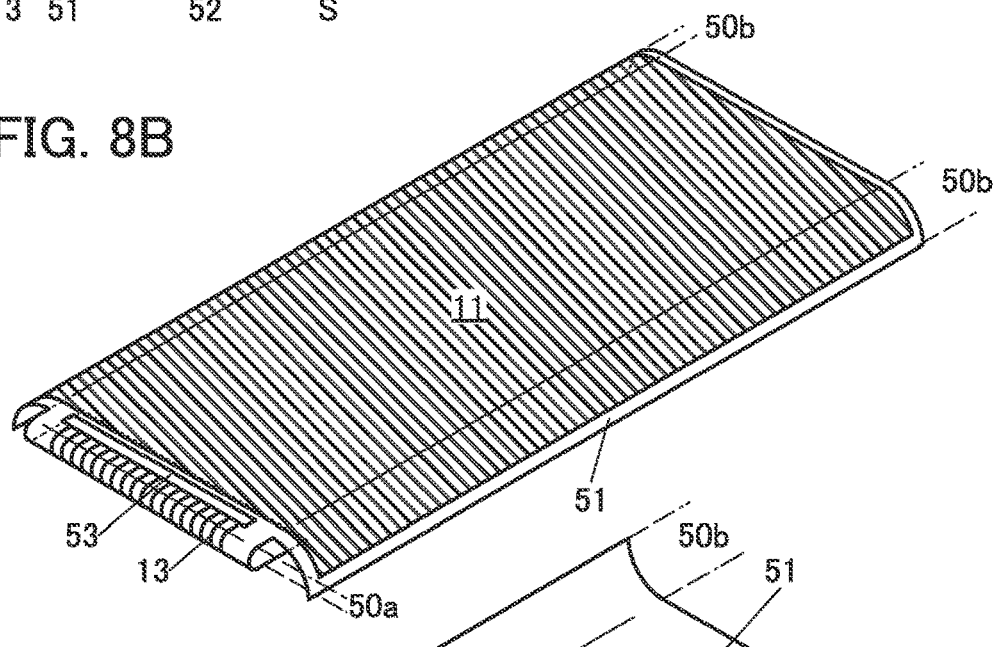
Figure 8C:
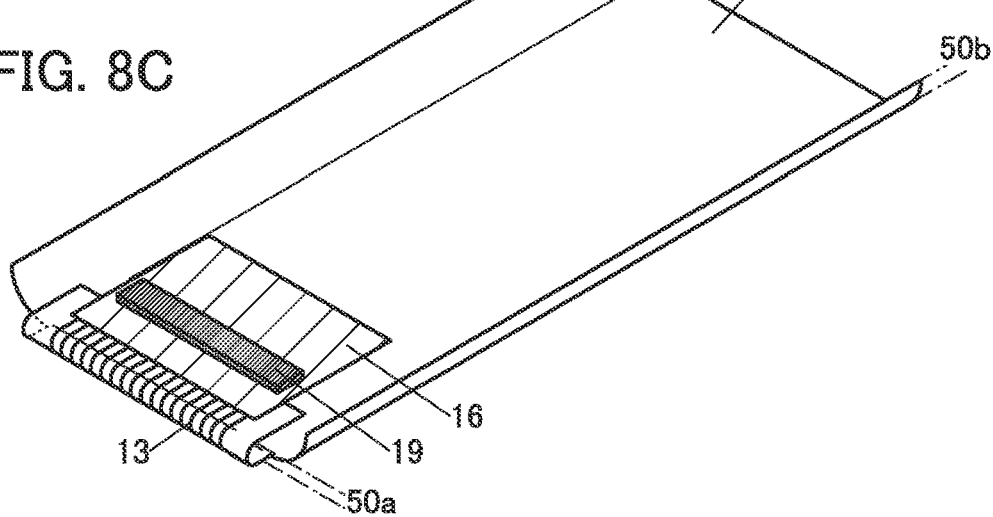

FIG. 8B and FIG. 8C are perspective views of the display device 10a in the case where the substrate 51 is bent at the bent portion 50a and the bent portions 50b to a side opposite to the display surface side. FIG. 8B is a perspective view including the display surface side, and FIG. 8C is a perspective view including the side opposite to the display surface side. Furthermore, FIG. 8C clearly shows the FPC 16 connected to the connection terminals 12.

When both sides of the display portion 11 are bent as illustrated in FIG. 8B, at the time of incorporating the display device 10a in an electronic device, bent display portions can be provided on both sides of the electronic device. Thus, a highly functional electronic device can be provided.

Furthermore, as illustrated in FIG. 8B and FIG. 8C, owing to the bent portion 50a, part of the substrate 51 can be folded back to the side opposite to the display surface side. Specifically, the projecting portion of the substrate 51 can be folded back so that the wirings 13 are on an outer side.

Accordingly, the connection terminals 12 and the wirings 15 can be placed on the side opposite to the display surface side; in addition, the FPC 16 can be placed on the side opposite to the display surface side. Thus, the area of a non-display portion can be reduced when the display device 10a is incorporated in an electronic device.

Furthermore, as illustrated in FIG. 8C, on the side opposite to the display surface side, part of the FPC 16 can cover an end portion of the substrate 51. Accordingly, even in the case where part of the wirings 15 (the end surface, the cut surface, or the like) are exposed, contact with a component such as a housing of an electronic device can be prevented; thus, the electronic device can have high reliability.

FIG. 8C shows an example in which the IC 19 is mounted on the FPC 16. The IC 19 is formed over a single crystal semiconductor substrate, for example, and includes a semiconductor chip including a circuit functioning as a source driver.

Structure Example 2

Figure 9A:
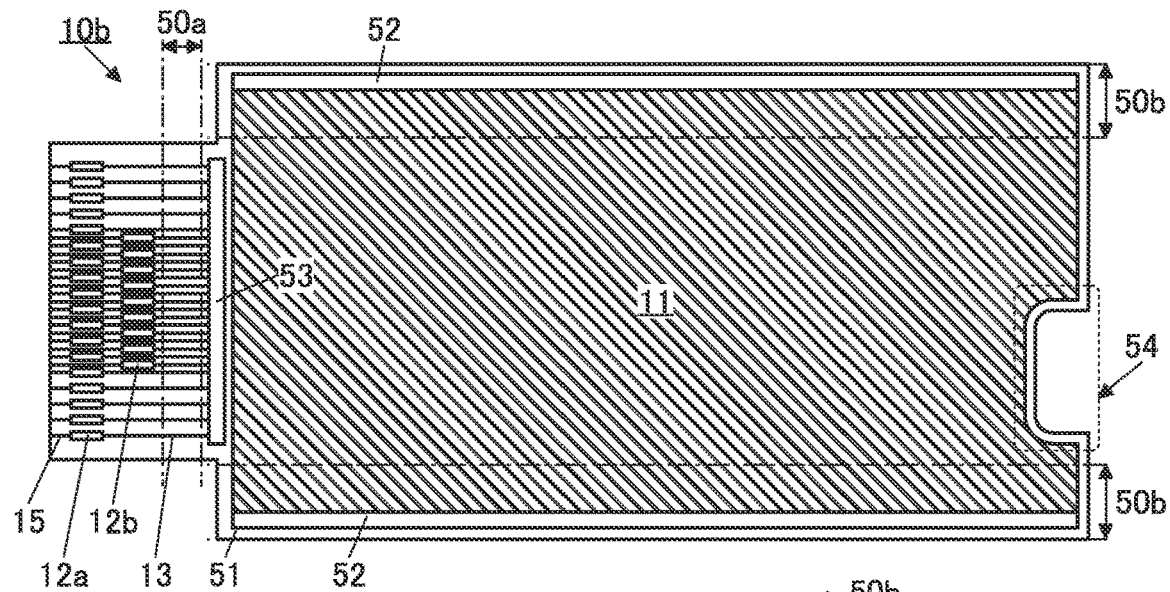
FIG. 9A to FIG. 9C are diagrams illustrating a structure example of a display device.
Figure 9B:
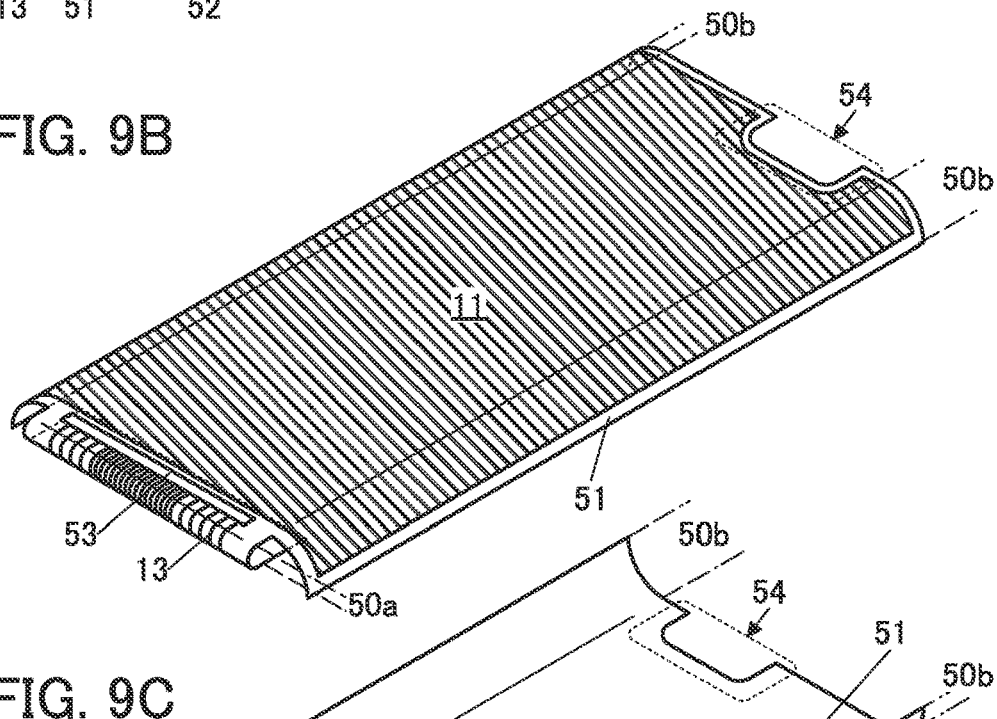
Figure 9C:
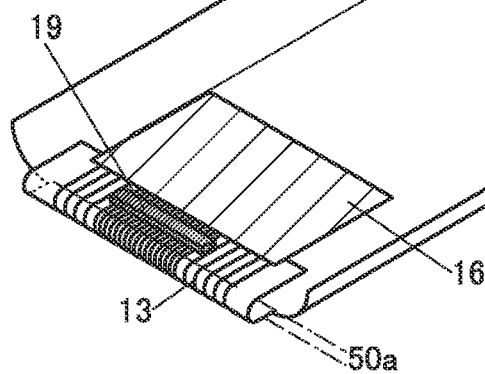

FIG. 9A, FIG. 9B and FIG. 9C show a top view and perspective views of a display device 10b having a structure partly different from the above.

The display device 10b includes connection terminals 12a to which the FPC 16 is connected and connection terminals 12b to which the IC 19 is connected in a projecting portion of the substrate 51. Furthermore, each of the plurality of wirings 15 is electrically connected to the connection terminal 12a or the connection terminal 12b. Accordingly, the IC 19 can be mounted on the substrate 51 as illustrated in FIG. 9C.

Furthermore, a notch 54 is provided in the substrate 51. The notch 54 is a portion in which, for example, a lens of a camera included in an electronic device, a variety of sensors such as an optical sensor, a lighting device, a design, or the like can be placed. Owing to the notch of part of the display portion 11, a further highly designed electronic device can be provided. In addition, owing to the notch, the screen occupation ratio with respect to the surface of a housing of an electronic device can be increased.

Structure Examples of Wiring

In the display device 10a and the display device 10b that are described above, when the bent portion 50a is bent with a smaller curvature radius, the thickness of the display device 10a or the display device 10b including the projecting portion can be smaller; thus, flexibility in designing an electronic device can be increased. In contrast, due to the small curvature radius of the bent portion 50a, the wirings 13 placed in the bent portion 50a might be disconnected. Structure examples of the wirings 13 that can be favorably used for the bent portion 50a are described below.

FIG. 10A to FIG. 10L show the top surface shapes of two adjacent wirings 13 including a portion placed in the bent portion 50a.

Figure 10A:
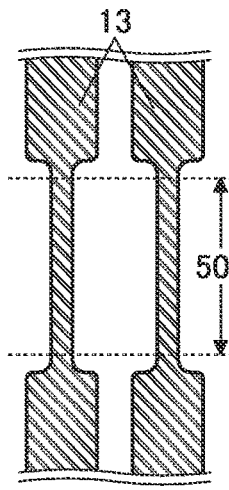
FIG. 10A to FIG. 10L are diagrams illustrating structure examples of a wiring.

Each of the wirings 13 illustrated in FIG. 10A has a narrower shape (small width) in the bent portion 50a than in other portions. Accordingly, cracks are less likely to occur when the wiring 13 is bent; thus, the strength can be increased.

Figure 10B:
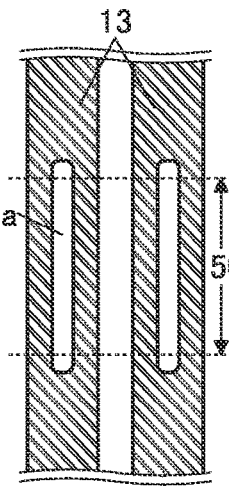
Figure 10C:
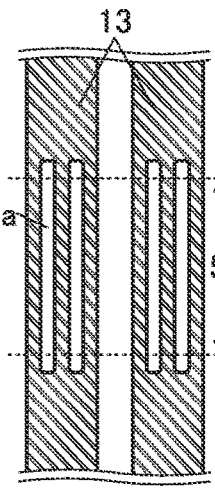
Figure 10D:
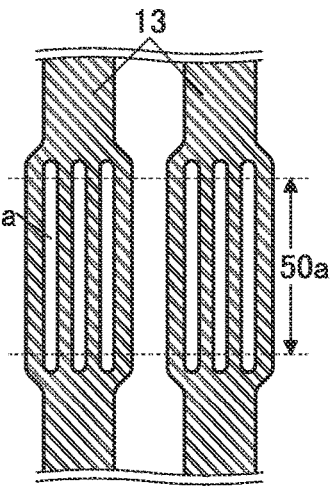

In the wirings 13 illustrated in FIG. 10B, FIG. 10C, and FIG. 10D, openings 13a provided in the range of the bent portion 50a in the extending direction of the wirings 13 are provided. In other words, each of the wirings 13 has a shape of a plurality of branched narrow portions. With such a structure, even when part of any of the wirings 13 is disconnected, conduction can be maintained by the other part.

Furthermore, each of the openings 13a is a portion having high adhesion because the insulating layer positioned below the wirings 13 (for example, the insulating layer 42) and the insulating layer positioned over the wirings 13 (for example, the insulating layer 43) are in contact with each other. Thus, each of the branched narrow portions of the wiring 13 placed in the bent portion 50a can be positioned between the portions having high adhesion; accordingly, film separation of the wirings 13 can be inhibited in the bent portion 50a.

FIG. 10B shows an example in which one opening 13a is provided to extend over the bent portion 50a so that the wiring 13 is branched into two. FIG. 10C shows an example in which two openings 13a are provided to extend over the bent portion 50a so that the wiring 13 is branched into three. FIG. 10C shows an example in which three openings 13a are provided to extend over the bent portion 50a so that the wiring 13 is branched into four. Note that the structure is not limited thereto, and four or more openings 13a may be provided.

Moreover, in FIG. 10D, portions of the wirings 13 that are placed in the bent portion 50a have shapes of expanding in the width direction. Accordingly, the widths of the plurality of branched portions can be increased, so that the wiring resistance can be low.

Figure 10E:
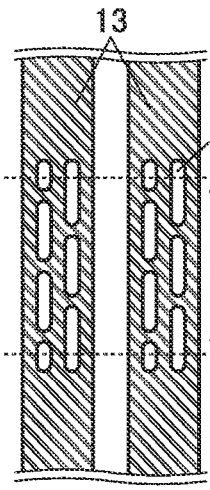
Figure 10F:
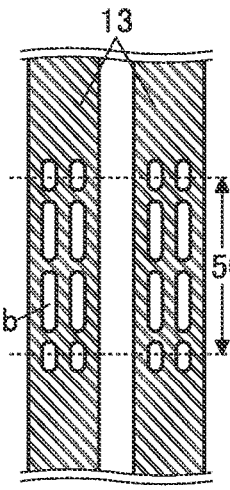

FIG. 10E and FIG. 10F each show an example in which a plurality of openings 13b are provided in the wiring 13. The length of each of the openings 13b in the extending direction of the wirings 13 is shorter than the length of the bent portion 50a. Accordingly, the strength of the wirings 13 and the adhesion can be increased and the wiring resistance can be reduced.

FIG. 10E shows an example in which the openings 13b on the left and the openings 13b on the right are placed in a staggered manner. Furthermore, FIG. 10F shows an example in which the openings 13b are placed in alignment, so that the wiring 13 has a checkered shape.

Figure 10G:
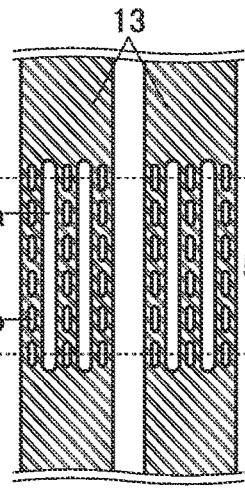
Figure 10H:
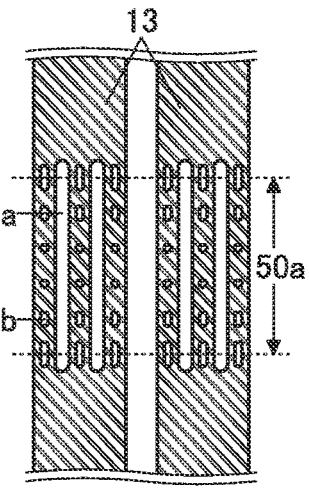

FIG. 10G and FIG. 10H each show an example in which both of the openings 13a extending over the bent portion 50a and the openings 13b each having a length shorter than the bent portion 50a are provided. With such a structure, the adhesion can be further increased.

FIG. 10G shows an example in which the openings 13b having the same shape are placed to extend over the bent portion 50a. Note that the structure is not limited thereto, and the openings 13b having different shapes may be arranged in the extending direction of the wirings 13. As an example, FIG. 10H shows an example in which the opening 13b that is closer to the center portion of the bent portion 50a has a smaller length.

Figure 10I:
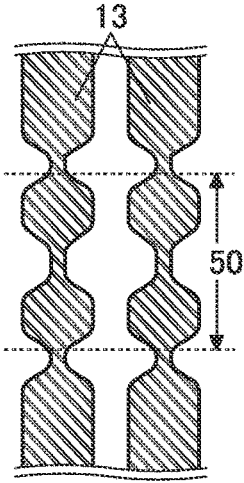
Figure 10J:
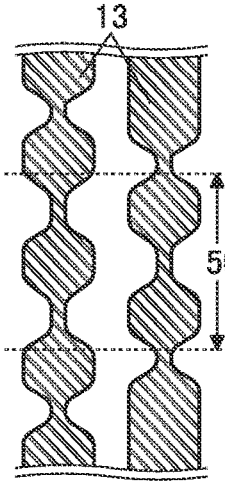

FIG. 10I and FIG. 10J each show an example in which a narrow portion and a wide portion are alternately repeated in the wirings 13. With such a structure, the narrow portions of the wirings 13 can be portions having high adhesion; thus, the film separation of the wirings 13 can be inhibited. Furthermore, providing such a plurality of narrow portions can increase not only the strength against the bending in the extending direction of the wirings 13 but also the strength against twisting.

FIG. 10I shows a case where two adjacent wirings 13 have the same shape. FIG. 10J shows a case of a different shape in which the wide portions and the narrow portions of two wirings 13 are placed in a staggered manner. With the structure illustrated in FIG. 10J, the interval between two adjacent wirings can be narrowed, leading to an increase in wiring density.

Figure 10K:
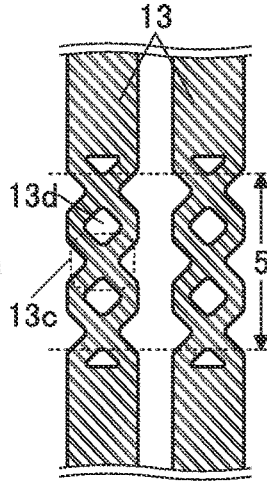
Figure 10L:
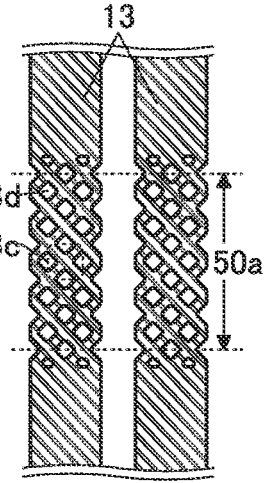

FIG. 10K and FIG. 10L each show an example in which the wirings 13 include a plurality of intersecting portions 13c. Furthermore, substantially rhombic openings 13d are provided with one intersecting portion positioned therebetween. With such a structure, the wiring 13 can have high strength against bending and twisting, high adhesion, and low wiring resistance.

FIG. 10K shows an example of a shape in which the intersecting portions 13c are arranged in a line in the extending direction of the wirings 13. FIG. 10L shows an example of a shape in which the intersecting portions 13c are arranged in a plurality of rows (here, three rows) in the extending direction of the wirings 13.

Here, as illustrated in each diagram of FIG. 10, the outlines of the wirings 13 and the outlines of the opening portions preferably each have a rounded shape such as a curved shape or an arc without including an angular portion (a portion having an acute angle or a portion having an obtuse angle). When the wirings 13 have angular portions, the angular portion becomes a starting point of a crack at the time of application of external force, and at worst, the wirings 13 might be disconnected. Thus, when the outlines of the wirings 13 and the outlines of the opening portions each have a rounded shape, a crack is less likely to occur in the wirings 13.

The above is the description of the structure examples of the wiring.

Cross-Sectional Structure Examples 2

More specific examples of a cross-sectional structure of the display device are described below.

Structure Example 1

Figure 11:
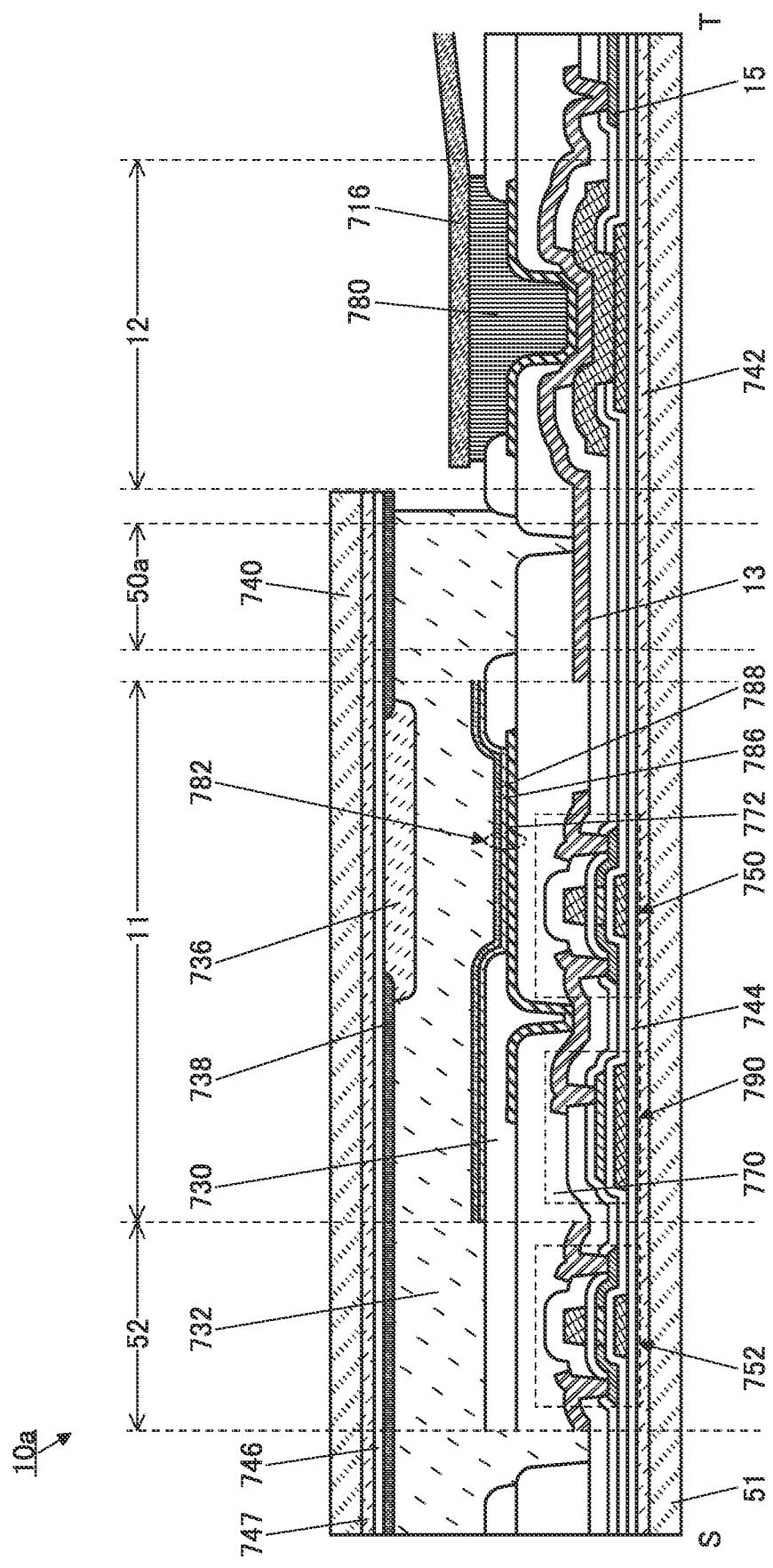
FIG. 11 is a diagram illustrating a cross-sectional structure example of a display device.

FIG. 11 is a schematic cross-sectional view of the display device 10a. FIG. 11 corresponds to a cross section taken along dashed-dotted line S-T of the display device 10a illustrated in FIG. 8A.

FIG. 11 shows a cross section including the display portion 11, the circuit portion 52, the bent portion 50a, and the connection terminal 12. A transistor 750 and a capacitor 790 are provided in the display portion 11. A transistor 752 is provided in the circuit portion 52. An FPC 716 is connected to the connection terminal 12 through a connector 780.

The transistor 750 and the transistor 752 are each a transistor using an oxide semiconductor for a semiconductor layer in which a channel is formed. Note that the transistors are not limited thereto, and a transistor using silicon (amorphous silicon, polycrystalline silicon, or single-crystal silicon) or a transistor using an organic semiconductor for the semiconductor layer can be used.

The transistor used in this embodiment includes a highly purified oxide semiconductor film in which formation of oxygen vacancies is inhibited. The off-state current of the transistors can be reduced significantly. Accordingly, in the pixel employing such a transistor, the retention time of an electrical signal such as an image signal can be extended, and the interval between writes of an image signal or the like can also be set longer. Accordingly, the frequency of refresh operations can be reduced, so that power consumption can be reduced.

The transistor used in this embodiment can have relatively high field-effect mobility and thus is capable of high-speed operation. For example, with the use of such a transistor capable of high-speed operation for a display device, a switching transistor in a pixel and a driver transistor used in a circuit portion can be formed over one substrate. That is, a structure in which a driver circuit formed using a silicon wafer or the like is not used is possible, in which case the number of components of the display device can be reduced. Moreover, the use of the transistor capable of high-speed operation also in the pixel can provide a high-quality image.

The capacitor 790 includes a lower electrode formed by processing the same film as a film used for the first gate electrode of the transistor 750 and an upper electrode formed by processing the same metal oxide film as a film used for the semiconductor layer. The upper electrode has reduced resistance like a source region and a drain region of the transistor 750. Part of an insulating film functioning as a first gate insulating layer of the transistor 750 is provided between the lower electrode and the upper electrode. That is, the capacitor 790 has a stacked-layer structure in which an insulating film functioning as a dielectric film is positioned between a pair of electrodes. A wiring obtained by processing the same film as a film used for a source electrode and a drain electrode of the transistor 750 is connected to the upper electrode.

An insulating layer 770 that functions as a planarization film is provided over the transistor 750, the transistor 752, and the capacitor 790.

The transistor 750 in the display portion 11 and the transistor 752 in the circuit portion 52 may have different structures. For example, a top-gate transistor may be used as one of the transistors 750 and 752, and a bottom-gate transistor may be used as the other. Note that this description as for the circuit portions 52 can be applied to the circuit portion 53.

Note that Cross-sectional structure example 1, which is described above, can be referred to for the structures of the transistor 750 and the transistor 752.

Cross-sectional structure example 1 and the modification examples, which are described above, can be referred to for the structures of the wiring 13, the connection terminal 12, and the wiring 15.

The display device 10a includes the substrate 51 and a substrate 740, each of which functions as a support substrate. As the substrate 51 and the substrate 740, a glass substrate or a substrate having flexibility such as a plastic substrate can be used, for example.

The transistor 750, the transistor 752, the capacitor 790, and the like are provided over the insulating layer 744. The substrate 51 and the insulating layer 744 are bonded to each other with the adhesive layer 742.

The display device 10a includes a light-emitting element 782, a coloring layer 736, a light-blocking layer 738, and the like.

The light-emitting element 782 includes a conductive layer 772, an EL layer 786, and a conductive layer 788. The conductive layer 772 is electrically connected to the source electrode or the drain electrode included in the transistor 750. The conductive layer 772 is provided over the insulating layer 770 and functions as a pixel electrode. An insulating layer 730 is provided to cover an end portion of the conductive layer 772. Over the insulating layer 730 and the conductive layer 772, the EL layer 786 and the conductive layer 788 are stacked.

For the conductive layer 772, a material having a property of reflecting visible light can be used. For example, a material containing aluminum, silver, or the like can be used. For the conductive layer 788, a material that transmits visible light can be used. For example, an oxide material containing indium, zinc, tin, or the like is preferably used. Thus, the light-emitting element 782 is a top-emission light-emitting element, which emits light to the side opposite the formation surface (the substrate 740 side).

The EL layer 786 contains an organic compound or an inorganic compound such as quantum dots. The EL layer 786 contains a light-emitting material that exhibits light when current flows.

As the light-emitting material, a fluorescent material, a phosphorescent material, a thermally activated delayed fluorescence (TADF) material, an inorganic compound (e.g., a quantum dot material), or the like can be used. Examples of materials that can be used for quantum dots include a colloidal quantum dot material, an alloyed quantum dot material, a core-shell quantum dot material, and a core quantum dot material.

The light-blocking layer 738 and the coloring layer 736 are provided on one surface of an insulating layer 746. The coloring layer 736 is provided in a position overlapping with the light-emitting element 782. The light-blocking layer 738 is provided in a region not overlapping with the light-emitting element 782 in the display portion 11. The light-blocking layer 738 may also be provided to overlap with the circuit portion 52 or the like.

The substrate 740 is bonded to the other surface of the insulating layer 746 with an adhesive layer 747. The substrate 740 and the substrate 51 are bonded to each other with a sealing layer 732.

Here, for the EL layer 786 included in the light-emitting element 782, a light-emitting material that exhibits white light emission is used. White light emission by the light-emitting element 782 is colored by the coloring layer 736 to be emitted to the outside. The EL layer 786 is provided over the pixels that exhibit different colors. The pixels provided with the coloring layer 736 transmitting any of red light (R), green light (G), and blue light (B) are arranged in a matrix in the display portion 11, whereby the display device 10*a* can perform full-color display.

A conductive film having a transmissive property and a reflective property may be used for the conductive layer 788. In this case, a microcavity structure is achieved between the conductive layer 772 and the conductive layer 788 such that light of a specific wavelength can be intensified to be emitted. Also in this case, an optical adjustment layer for adjusting an optical distance may be placed between the conductive layer 772 and the conductive layer 788 such that the thickness of the optical adjustment layer differs between pixels of different colors and accordingly the color purity of light emitted from each pixel can be increased.

Note that a structure in which the coloring layer 736 or the above optical adjustment layer is not provided may be employed when the EL layer 786 is formed into an island shape for each pixel or into a stripe shape for each pixel column, i.e., the EL layer 786 is formed by separate coloring.

Here, an inorganic insulating film that functions as a barrier film having low permeability is preferably used for each of the insulating layer 744 and the insulating layer 746. With such a structure in which the light-emitting element 782, the transistor 750, and the like are interposed between the insulating layer 744 and the insulating layer 746, deterioration of them can be inhibited and a highly reliable display device can be achieved.

Structure Example 2

Figure 12:
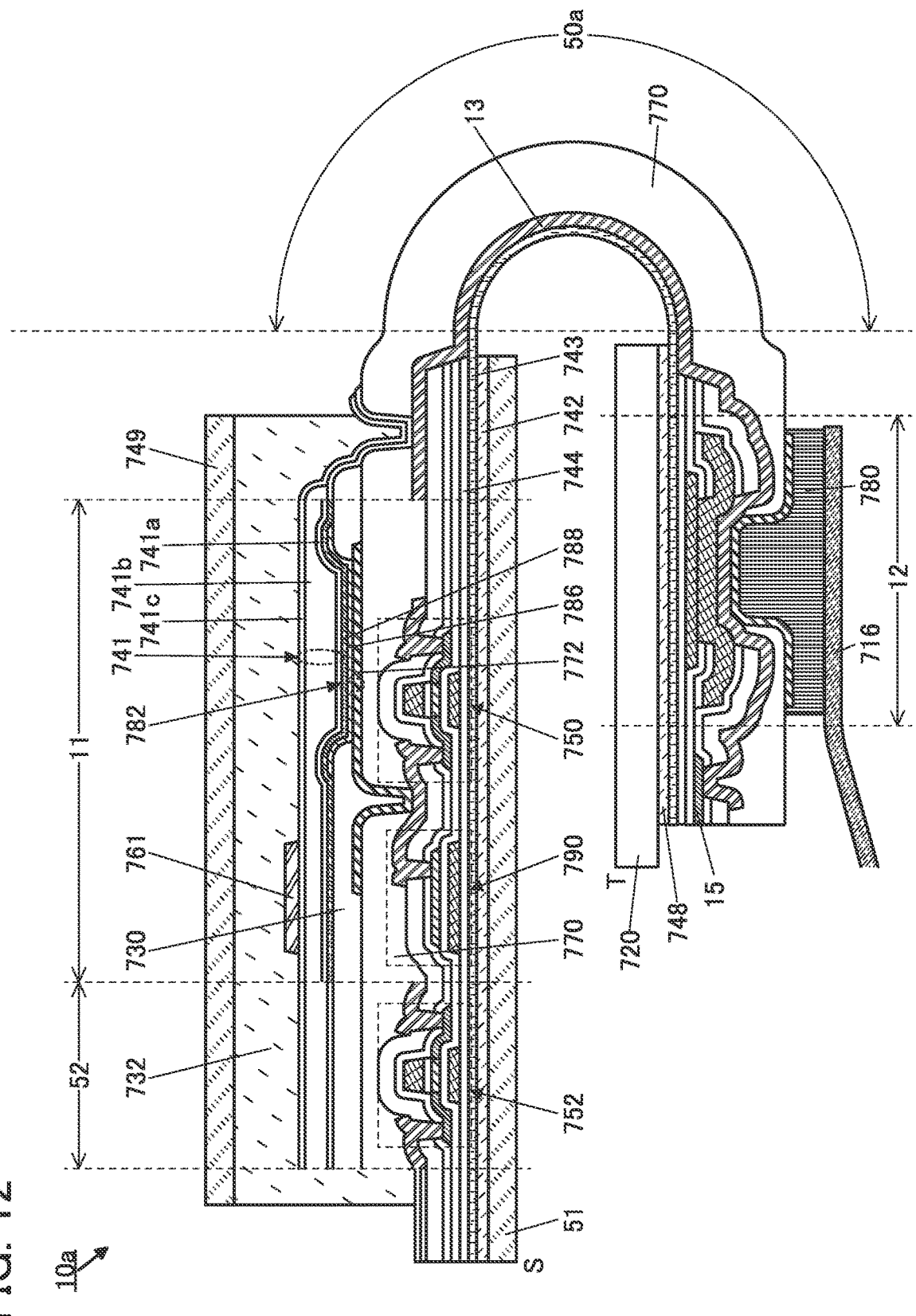
FIG. 12 is a diagram illustrating a cross-sectional structure example of a display device.

FIG. 12 is a cross-sectional view of the display device 10*a* having a structure partly different from that of FIG. 11. Furthermore, FIG. 12 clearly shows an embodiment in which part of the display device 10*a* is bent in the bent portion 50*a* and folded back to the side opposite to the display surface side.

In the display device 10*a* illustrated in FIG. 12, a resin layer 743 is provided between the adhesive layer 742 and the insulating layer 744 illustrated in FIG. 11. A protection layer 749 is provided instead of the substrate 740.

The resin layer 743 is a layer containing an organic resin such as polyimide or acrylic. The insulating layer 744 contains an inorganic insulating material such as silicon oxide, silicon oxynitride, silicon nitride, or the like. The resin layer 743 and the substrate 51 are attached to each other with the bonding layer 742. The resin layer 743 is preferably thinner than the substrate 51.

The protection layer 749 is attached to the sealing layer 732. A glass substrate, a resin film, or the like can be used as the protection layer 749. As the protection layer 749, an optical member such as a polarizing plate (including a circularly polarizing plate) or a scattering plate, an input device such as a touch sensor panel, or a structure in which two or more of the above are stacked may be employed. Furthermore, the protection layer 749 may include a component included in part of a housing of an electronic device (for example, a portion to be a screen).

The EL layer 786 included in the light-emitting element 782 is provided over the insulating layer 730 and the conductive layer 772 in an island shape. The EL layers 786 are formed separately so that respective subpixels emit light of different colors, whereby color display can be performed without use of the coloring layer 736.

A protective layer 741 is provided to cover the light-emitting element 782. The protective layer 741 has a function of preventing diffusion of impurities such as water into the light-emitting element 782. The protection layer 741 has a stacked-layer structure in which an insulating layer 741*a*, an insulating layer 741*b*, and an insulating layer 741*c* are stacked in this order from the conductive layer 788 side. In that case, it is preferable that inorganic insulating films with a high barrier property against impurities such as water be used as the insulating layer 741*a* and the insulating layer 741*c*, and an organic insulating film that functions as a planarization film be used as the insulating layer 741*b*. The protection layer 741 is preferably provided to extend also to the circuit portion 52 and the like.

An organic insulating film covering the transistor 750, the transistor 752, and the like is preferably formed in an island shape inward from the sealing layer 732. In other words, an end portion of the organic insulating film is preferably inward from the sealing layer 732 or in a region overlapping with an end portion of the sealing layer 732. FIG. 12 shows an example in which the insulating layer 770, the insulating layer 730, and the insulating layer 741*b* are processed into island shapes. The insulating layer 741*c* and the insulating layer 741*a* are provided in contact with each other in a portion overlapping with the sealing layer 732, for example. Thus, a surface of the organic insulating film covering the transistor 750 and the transistor 752 is not exposed to the outside of the sealing layer 732, whereby diffusion of water or hydrogen from the outside to the transistor 750 and the transistor 752 through the organic insulating film can be favorably prevented. This can reduce variations in electrical characteristics of the transistors, so that a display device with extremely high reliability can be fabricated.

In FIG. 12, the bent portion 50a includes a portion where the substrate 51, the bonding layer 742, and the inorganic insulating film such as the insulating layer 744 are not provided. The bent portion 50a has a structure in which the insulating layer 770 including an organic material covers the wiring 13 so that the wiring 13 is not exposed. In the structure illustrated in FIG. 12, the bent portion 50a has a stacked-layer structure in which the resin layer 743, the wiring 13, and the insulating layer 770 are stacked.

When a structure is employed in which an inorganic insulating film is not provided if possible in the bent portion 50a and only a conductive layer containing a metal or an alloy and a layer containing an organic material are stacked, generation of cracks caused at bending can be prevented. When the substrate 51 is not provided in the bent portion 50a, part of the display device 10a can be bent with an extremely small radius of curvature.

In a region overlapping with the connection terminal 12, a support 720 is bonded to the resin layer 743 with a bonding layer 748 positioned therebetween. A material having higher rigidity than the substrate 51 and the like can be used for the support 720. Alternatively, the support 720 may be part of a housing of an electronic device or part of a component placed in an electronic device.

In FIG. 12, a conductive layer 761 is provided over the protection layer 741. The conductive layer 761 can be used as a wiring or an electrode.

In the case where a touch sensor is provided so as to overlap with the display device 10a, the conductive layer 761 can function as an electrostatic shielding film for preventing transmission of electrical noise to the touch sensor during pixel driving. In this case, the structure in which a predetermined constant potential is applied to the conductive layer 761 can be employed.

Alternatively, the conductive layer 761 can be used as an electrode of the touch sensor, for example. This enables the display device 10a to function as a touch panel. For example, the conductive layer 761 can be used as an electrode or a wiring of a capacitive touch sensor. In this case, the conductive layer 761 can be used as a wiring or an electrode to which a sensor circuit is connected or a wiring or an electrode to which a sensor signal is input. When the touch sensor is formed over the light-emitting element 782 in this manner, the number of components can be reduced, and manufacturing cost of an electronic device or the like can be reduced.

The conductive layer 761 is preferably provided in a portion not overlapping with the light-emitting element 782. The conductive layer 761 can be provided in a position overlapping with the insulating layer 730, for example. Thus, a transparent conductive film with a relatively low conductivity is not necessarily used for the conductive layer 761, and a metal or an alloy having high conductivity or the like can be used, so that the sensitivity of the sensor can be increased.

As the type of the touch sensor that can be formed of the conductive layer 761, a variety of types such as a resistive type, a surface acoustic wave type, an infrared type, an optical type, and a pressure-sensitive type can be used, without limitation to a capacitive type. Alternatively, two or more of these types may be combined and used.

Structure Example 3

Figure 13:
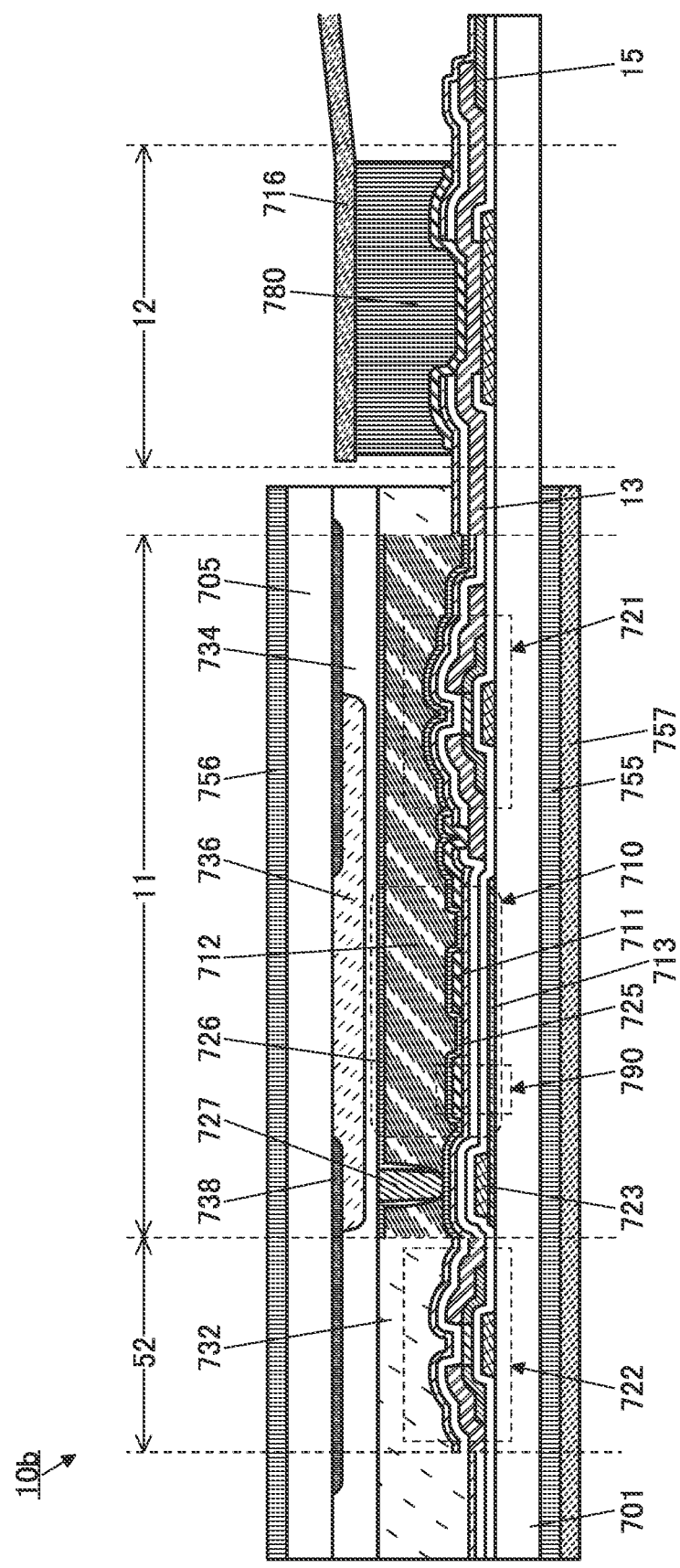
FIG. 13 is a diagram illustrating a cross-sectional structure example of a display device.

FIG. 13 illustrates a schematic cross-sectional view of the display device 10b in the case where a liquid crystal element is used as a display element. FIG. 13 illustrates a cross-sectional view of a region including the circuit portion 52, the display portion 11, and the connection terminal 12.

The display device 10b illustrated in FIG. 13 includes a transistor 721, a transistor 722, a liquid crystal element 710, and the like between a substrate 701 and a substrate 705. The substrate 701 and the substrate 705 are bonded to each other with the sealing layer 732.

Here, an example in which bottom-gate transistors are used as the transistor 721 and the transistor 722. Cross-sectional structure example 1, which is described above, can be referred to for the transistors, the wiring 13, the connection terminal 12, the wiring 15, and the like.

The liquid crystal element 710 includes a conductive layer 711, a liquid crystal 712, and a conductive layer 713. The conductive layer 713 is provided over the substrate 701. One or more insulating layers are provided over the conductive layer 713, and the conductive layer 711 is provided over the insulating layer(s). Furthermore, the liquid crystal 712 is positioned between the conductive layer 711 and the substrate 705. The conductive layer 713 is electrically connected to a wiring 723 and functions as a common electrode. The conductive layer 711 is electrically connected to the transistor 721 and serves as a pixel electrode. A common potential is applied to the wiring 723.

The liquid crystal element 710 illustrated in FIG. 13 is a liquid crystal element to which a horizontal electric field mode (for example, an FFS (Fringe Field Switching) mode) is applied. The conductive layer 711 has a comb-like top surface shape or a top surface shape including a slit. In the liquid crystal element 710, the alignment state of the liquid crystal 712 is controlled by an electric field generated between the conductive layer 711 and the conductive layer 713.

Furthermore, the capacitor 790 functioning as a storage capacitor is formed of a stacked-layer structure of the conductive layer 711, the conductive layer 713, and one or more insulating layers sandwiched between the conductive layer 711 and the conductive layer 713. Thus, another capacitor is not necessarily provided, and thus the aperture ratio can be increased.

A material that transmits visible light or a material that reflects visible light can be used for the conductive layer 711 and the conductive layer 713. As a light-transmitting material, for example, an oxide material containing indium, zinc, tin, or the like is preferably used. As a reflective material, for example, a material containing aluminum, silver, or the like is preferably used.

When a reflective material is used for one or both of the conductive layer 711 and the conductive layer 713, the display device 10b is a reflective liquid crystal display device. In contrast, when a light-transmitting material is used for both of the conductive layer 711 and the conductive layer 713, the display device 10b is a transmissive liquid crystal display device. For a reflective liquid crystal display device, a polarizing plate is provided on the viewer side. By contrast, for a transmissive liquid crystal display device, a pair of polarizing plates is provided so that the liquid crystal element is placed therebetween.

FIG. 13 shows an example of a transmissive liquid crystal display device. A polarizing plate 755 and a light source 757 are provided on the outer side of the substrate 701, and a polarizing plate 756 is provided on the outer side of the substrate 705. The light source 757 functions as a backlight.

The light-blocking layer 738 and the coloring layer 736 are provided on a surface of the substrate 705 that is on the substrate 701 side. An insulating layer 734 functioning as a planarization layer is provided to cover the light-blocking layer 738 and the coloring layer 736. A spacer 727 is provided on a surface of the insulating layer 734 that is on the substrate 701 side.

The liquid crystal 712 is positioned between an alignment film 725 covering the conductive layer 711 and an alignment film 726 covering the insulating layer 734. Note that the alignment film 725 and the alignment film 726 are not necessarily provided when not needed.

Although not illustrated in FIG. 13, an optical member (optical film) such as a retardation film or an anti-reflection film, a protection film, an antifouling film, or the like can be provided on the outer side of the substrate 705 as appropriate. As the anti-reflection film, an AG (Anti Glare) film, an AR (Anti Reflection) film, or the like can be given.

As the liquid crystal 712, a thermotropic liquid crystal, a low-molecular liquid crystal, a high-molecular liquid crystal, a polymer dispersed liquid crystal (PDLC), a polymer network liquid crystal (PNLC), a ferroelectric liquid crystal, an anti-ferroelectric liquid crystal, or the like can be used. In the case where a horizontal electric field mode is employed, a liquid crystal exhibiting a blue phase for which an alignment film is not used may be used.

As the mode of the liquid crystal element, a TN (Twisted Nematic) mode, a VA (Vertical Alignment) mode, an IPS (In-Plane-Switching) mode, an FFS mode, an ASM (Axially Symmetric aligned Micro-cell) mode, an OCB (Optically Compensated Birefringence) mode, an ECB (Electrically Controlled Birefringence) mode, a guest-host mode, or the like can be employed.

In addition, a scattering liquid crystal employing a polymer dispersed liquid crystal, a polymer network liquid crystal, or the like can be used for the liquid crystal 712. At this time, monochrome image display may be performed without the coloring layer 736, or color display may be performed using the coloring layer 736.

As a driving method of the liquid crystal element, a time-division display method (also referred to as a field-sequential driving method) by which color display is performed by a successive additive color mixing method may be used. In that case, a structure without the coloring layer 736 can be employed. In the case where the time-division display method is employed, advantages such as the aperture ratio of each pixel or the resolution being increased can be obtained because subpixels that emit light of, for example, R (red), G (green), and B (blue), are not necessarily provided.

The display device 10b illustrated in FIG. 13 has a structure in which an organic insulating film functioning as a planarization layer is not provided on a surface on which the conductive layer 711 functioning as a pixel electrode or the conductive layer 713 functioning as a common electrode is provided. Furthermore, bottom-gate transistors, which have a relatively small number of manufacturing steps, are used as the transistor 721 and the like included in the display device 10b. Moreover, as described above, the wiring 13, the connection terminal 12, the wiring 15, and the like can be manufactured with steps common to the manufacturing steps of the transistors, the liquid crystal element, and the like without special steps. With such a structure, the manufacturing cost can be reduced and the manufacturing yield can be increased, so that a display device having high reliability can be provided at low cost.

The above is the description of Cross-sectional structure example 2.

Components

Components such as a transistor that can be used in the display device are described below.

Substrate

Although there is no particular limitation on a material and the like of the substrate, it is necessary that the substrate have heat resistance high enough to withstand at least heat treatment performed later. For example, a single crystal semiconductor substrate or a polycrystalline semiconductor substrate containing silicon or silicon carbide as a material, a compound semiconductor substrate of silicon germanium or the like, an SOI substrate, a glass substrate, a ceramic substrate, a quartz substrate, a sapphire substrate, or the like may be used as the substrate. Alternatively, any of these substrates over which a semiconductor element is provided may be used as the substrate.

Furthermore, a flexible substrate may be used as the substrate and the display device may be formed directly on the flexible substrate. Alternatively, a separation layer may be provided between the substrate and the display device. After part or the whole of the display device is completed over the separation layer, the separation layer can be used for separation from the substrate and transfer to another substrate. In that case, the display device can be transferred to even a substrate having low heat resistance or a flexible substrate.

Transistor

The transistors each include a conductive layer functioning as a gate electrode, a semiconductor layer, a conductive layer functioning as a source electrode, a conductive layer functioning as a drain electrode, and an insulating layer functioning as a gate insulating layer.

Note that there is no particular limitation on the structure of the transistor included in the display device of one embodiment of the present invention. For example, a planar transistor may be employed, a staggered transistor may be employed, or an inverted staggered transistor may be employed. A top-gate or bottom-gate transistor structure may be employed. Alternatively, gate electrodes may be provided above and below a channel.

There is no particular limitation on the crystallinity of a semiconductor material used for the transistors, and any of an amorphous semiconductor, a single crystal semiconductor, and a semiconductor having crystallinity other than single crystal (a microcrystalline semiconductor, a polycrystalline semiconductor, or a semiconductor partly including crystal regions) may be used. It is preferable that a single crystal semiconductor or a semiconductor having crystallinity be used, in which case deterioration of the transistor characteristics can be inhibited.

In particular, a transistor that uses a metal oxide film for a semiconductor layer where a channel is formed is described below.

As a semiconductor material used for the transistors, a metal oxide whose energy gap is greater than or equal to 2 eV, preferably greater than or equal to 2.5 eV, further preferably greater than or equal to 3 eV can be used. A typical example thereof is a metal oxide containing indium, and for example, a CAC-OS described later or the like can be used.

A transistor with a metal oxide having a larger band gap and a lower carrier concentration than silicon has a low off-state current; therefore, charges stored in a capacitor that is series-connected to the transistor can be held for a long time.

The semiconductor layer can be, for example, a film represented by an In-M-Zn-based oxide that contains indium, zinc, and M (M is a metal such as aluminum, titanium, gallium, germanium, yttrium, zirconium, lanthanum, cerium, tin, neodymium, or hafnium).

In the case where a metal oxide that constitutes the semiconductor layer is an In-M-Zn-based oxide, it is preferable that the atomic ratio of metal elements in a sputtering target used to deposit an In-M-Zn oxide satisfy In M and Zn M. The atomic ratio between metal elements in such a sputtering target is preferably, for example, In:M:Zn=1:1:1, In:M:Zn=1:1:1.2, In:M:Zn=3:1:2, In:M:Zn=4:2:3, In:M: Zn=4:2:4.1, In:M:Zn=5:1:6, In:M:Zn=5:1:7, or In:M:Zn=5: 1:8. Note that the atomic ratio between metal elements in the formed semiconductor layer may vary from the above atomic ratio between metal elements in the sputtering target in a range of ±40%.

A metal oxide film with a low carrier concentration is used as the semiconductor layer. For example, for the semiconductor layer, a metal oxide whose carrier concentration is lower than or equal to $1\times10^{17}$ cm$^{-3}$, preferably lower than or equal to $1\times10^{15}$ cm$^{-3}$, further preferably lower than or equal to $1\times10^{13}$ cm$^3$, still further preferably lower than or equal to $1\times10^{11}$ cm$^3$, even further preferably lower than $1\times10^{10}$ cm$^3$, and higher than or equal to $1\times10^{-9}$ cm$^3$ can be used. Such a metal oxide is referred to as a highly purified intrinsic or substantially highly purified intrinsic metal oxide. The oxide semiconductor has a low density of defect states and thus can be regarded as a metal oxide semiconductor having stable characteristics.

Note that, without limitation to these, an oxide semiconductor with an appropriate composition may be used in accordance with required semiconductor characteristics and electrical characteristics (e.g., field-effect mobility and threshold voltage) of the transistor. In addition, to obtain the required semiconductor characteristics of the transistor, it is preferable that the carrier concentration, impurity concentration, defect density, atomic ratio between a metal element and oxygen, interatomic distance, density, and the like of the semiconductor layer be set to be appropriate.

When silicon or carbon, which is one of the Group 14 elements, is contained in the metal oxide that constitutes the semiconductor layer, oxygen vacancies are increased, and the semiconductor layer becomes n-type. Thus, the concentration of silicon or carbon (measured by secondary ion mass spectrometry) in the semiconductor layer is set to $2\times10^{18}$ atoms/cm$^3$ or lower, preferably $2\times10^{17}$ atoms/cm$^3$ or lower.

Alkali metal and alkaline earth metal might generate carriers when bonded to a metal oxide, in which case the off-state current of the transistor might be increased. Thus, the concentration of alkali metal or alkaline earth metal in the semiconductor layer is set to lower than or equal to $1\times10^{18}$ atoms/cm$^3$, preferably lower than or equal to $2\times10^{16}$ atoms/cm$^3$.

Furthermore, when nitrogen is contained in the metal oxide that constitutes the semiconductor layer, electrons serving as carriers are generated and the carrier concentration is increased, so that the semiconductor layer easily becomes n-type. As a result, a transistor using a metal oxide that contains nitrogen is likely to have normally-on characteristics. Therefore, the concentration of nitrogen in the semiconductor layer, which is measured by secondary ion mass spectrometry, is preferably set to lower than or equal to $5\times10^{18}$ atoms/cm$^3$.

Oxide semiconductors are classified into a single crystal oxide semiconductor and a non-single-crystal oxide semiconductor. Examples of the non-single-crystal oxide semiconductor include a CAAC-OS (c-axis-aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

Note that the non-single-crystal oxide semiconductor can be suitably used for a semiconductor layer of a transistor disclosed in one embodiment of the present invention. As the non-single-crystal oxide semiconductor, the nc-OS or the CAAC-OS can be suitably used.

The semiconductor layer may be a mixed film including two or more of a region of a CAAC-OS, a region of a polycrystalline oxide semiconductor, a region of an nc-OS, a region of an amorphous-like oxide semiconductor, and a region of an amorphous oxide semiconductor. The mixed film has, for example, a single-layer structure or a layered structure including two or more of the foregoing regions in some cases.

A CAC-OS (Cloud-Aligned Composite oxide semiconductor) is preferably used for a semiconductor layer of a transistor disclosed in one embodiment of the present invention. The use of the CAC-OS allows the transistor to have high electrical characteristics or high reliability.

A CAAC (c-axis aligned crystal) is described below. A CAAC refers to an example of a crystal structure.

The CAAC structure is a crystal structure of a thin film or the like that has a plurality of nanocrystals (crystal regions having a maximum diameter of less than 10 nm), characterized in that the nanocrystals have c-axis alignment in a particular direction and are not aligned but continuously connected in the a-axis and b-axis directions without forming a grain boundary. In particular, a thin film having the CAAC structure is characterized in that the c-axes of nanocrystals are likely to be aligned in a film thickness direction, a normal direction of a surface where the thin film is formed, or a normal direction of a surface of the thin film.

A CAAC-OS (Oxide Semiconductor) is an oxide semiconductor with high crystallinity. By contrast, in the CAAC-OS, it can be said that a reduction in electron mobility due to the crystal grain boundary is less likely to occur because a clear crystal grain boundary cannot be observed. Moreover, since the crystallinity of an oxide semiconductor might be decreased by entry of impurities, formation of defects, or the like, the CAAC-OS can be regarded as an oxide semiconductor that has small amounts of impurities and defects (oxygen vacancies or the like). Thus, an oxide semiconductor including a CAAC-OS is physically stable. Therefore, the oxide semiconductor including the CAAC-OS is resistant to heat and has high reliability.

Here, in crystallography, in a unit cell formed with three axes (crystal axes) of the a-axis, the b-axis, and the c-axis, a specific axis is generally taken as the c-axis. In particular, in the case of a crystal having a layered structure, two axes parallel to the plane direction of a layer are regarded as the a-axis and the b-axis and an axis intersecting with the layer is regarded as the c-axis in general. Typical examples of such a crystal having a layered structure include graphite, which is classified as a hexagonal system. In a unit cell of graphite, the a-axis and the b-axis are parallel to a cleavage plane and the c-axis is orthogonal to the cleavage plane. For example, an InGaZnO$_4$ crystal having a YbFe$_2$O$_4$ type crystal structure, which is a layered structure, can be classified as a hexagonal system, and in a unit cell thereof, the a-axis and the b-axis are parallel to the plane direction of a layer and the c-axis is orthogonal to the layer (i.e., the a-axis and the b-axis).

In an image observed with a TEM, crystal parts cannot be found clearly in an oxide semiconductor film having a microcrystalline structure (a microcrystalline oxide semiconductor film) in some cases. In most cases, the size of a crystal part included in the microcrystalline oxide semiconductor film is greater than or equal to 1 nm and less than or equal to 100 nm, or greater than or equal to 1 nm and less than or equal to 10 nm. In particular, an oxide semiconductor film including a nanocrystal (nc) that is a microcrystal with a size greater than or equal to 1 nm and less than or equal to 10 nm, or greater than or equal to 1 nm and less than or equal to 3 nm is referred to as an nc-OS (nanocrystalline Oxide Semiconductor) film. In an image observed with a TEM, for example, a crystal grain boundary cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different crystal parts in the nc-OS film. Thus, the orientation in the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than the size of a crystal part, a peak that shows a crystal plane does not appear. Furthermore, a diffraction pattern like a halo pattern is observed when the nc-OS film is subjected to electron diffraction (also referred to as selected-area electron diffraction) using an electron beam with a probe diameter (e.g., 50 nm or larger) larger than the diameter of a crystal part. Meanwhile, in some cases, a circular (ring-like) region with high luminance is observed in an electron diffraction pattern (also referred to as nanobeam electron diffraction pattern) of the nc-OS film, which is obtained using an electron beam with a probe diameter (e.g., 1 nm or larger and 30 nm or smaller) close to or smaller than the diameter of a crystal part, and spots are observed in the ring-like region.

The nc-OS film has a lower density of defect states than an amorphous oxide semiconductor film. Note that there is no regularity of crystal orientation between different crystal parts in the nc-OS film. Thus, the nc-OS film has a higher density of defect states than the CAAC-OS film. Accordingly, the nc-OS film has a higher carrier concentration and higher electron mobility than the CAAC-OS film in some cases. Therefore, a transistor using the nc-OS film may have high field-effect mobility.

The nc-OS film can be formed at a smaller oxygen flow rate ratio in formation than the CAAC-OS film. The nc-OS film can also be formed at a lower substrate temperature in formation than the CAAC-OS film. For example, the nc-OS film can be formed at a relatively low substrate temperature (e.g., a temperature of 130° C. or lower) or without heating of the substrate and thus is suitable for the case of using a large glass substrate, a resin substrate, or the like, and productivity can be increased.

An example of a crystal structure of a metal oxide is described. A metal oxide that is formed by a sputtering method using an In—Ga—Zn oxide target (In:Ga:Zn=4:2: 4.1 [atomic ratio]) at a substrate temperature higher than or equal to 100° C. and lower than or equal to 130° C. is likely to have either the nc (nano crystal) structure or the CAAC structure, or a structure in which both structures are mixed. By contrast, a metal oxide formed at a substrate temperature set at room temperature (R.T.) is likely to have the nc structure. Note that room temperature (R.T.) here also includes a temperature in the case where a substrate is not heated intentionally.

Composition of CAC-OS

The composition of a CAC (Cloud-Aligned Composite)-OS that can be used in a transistor disclosed in one embodiment of the present invention is described below.

A CAC-OS refers to one composition of a material in which elements constituting a metal oxide are unevenly distributed with a size greater than or equal to 0.5 nm and less than or equal to 10 nm, preferably greater than or equal to 1 nm and less than or equal to 2 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 2 nm, or a similar size in a metal oxide is hereinafter referred to as a mosaic pattern or a patch-like pattern.

Note that the metal oxide preferably contains at least indium. In particular, indium and zinc are preferably contained. In addition, one or more of aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide (InO$_{X1}$, where X1 is a real number greater than 0) or indium zinc oxide (In$_{X2}$Zn$_{Y2}$O$_{Z2}$, where X2, Y2, and Z2 are real numbers greater than 0), and gallium oxide (GaO$_{X3}$, where X3 is a real number greater than 0) or gallium zinc oxide (Ga$_{X4}$Zn$_{Y4}$O$_{Z4}$, where X4, Y4, and Z4 are real numbers greater than 0), and a mosaic pattern is formed. Then, InO$_{X1}$ or In$_{X2}$Zn$_{Y2}$O$_{Z2}$ forming the mosaic pattern is evenly distributed in the film. This composition is also referred to as a cloud-like composition.

That is, the CAC-OS is a composite metal oxide having a composition in which a region including GaO$_{X3}$ as a main component and a region including In$_{X2}$Zn$_{Y2}$O$_{Z2}$ or InO$_{X1}$ as a main component are mixed. Note that in this specification, when the atomic ratio of In to an element M in a first region is greater than the atomic ratio of In to an element M in a second region, for example, the first region is described as having higher In concentration than the second region.

Note that a compound containing In, Ga, Zn, and O is also known as IGZO. Typical examples of IGZO include a crystalline compound represented by InGaO$_3$(ZnO)$_{m1}$ (m1 is a natural number) and a crystalline compound represented by In$_{(1+x0)}$Ga$_{(1-x0)}$O$_3$(ZnO)$_{m0}$ ($-1 \leq x0 \leq 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

Meanwhile, the CAC-OS relates to the material composition of a metal oxide. In a material composition of a CAC-OS containing In, Ga, Zn, and O, nanoparticle regions containing Ga as a main component are observed in part of the CAC-OS and nanoparticle regions containing In as a main component are observed in part thereof. These nanoparticle regions are randomly dispersed to form a mosaic pattern. Therefore, the crystal structure is a secondary element for the CAC-OS.

Note that in the CAC-OS, a layered structure including two or more films with different atomic ratios is not included. For example, a two-layer structure of a film containing In as a main component and a film containing Ga as a main component is not included.

A boundary between the region containing $GaO_{X3}$ as a main component and the region containing $In_{X2}Zn_{Y2}O_{Z2}$ or $InO_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions containing the selected metal element(s) as a main component(s) are observed in part of the CAC-OS and nanoparticle regions containing In as a main component are observed in part of the CAC-OS, and these nanoparticle regions are randomly dispersed to form a mosaic pattern in the CAC-OS.

The CAC-OS can be formed by a sputtering method under a condition where a substrate is not heated intentionally, for example. Moreover, in the case of forming the CAC-OS by a sputtering method, any one or more selected from an inert gas (typically, argon), an oxygen gas, and a nitrogen gas are used as a deposition gas. The flow rate of the oxygen gas to the total flow rate of the deposition gas in deposition is preferably as low as possible, for example, the flow rate of the oxygen gas is higher than or equal to 0% and lower than 30%, preferably higher than or equal to 0% and lower than or equal to 10%.

The CAC-OS is characterized in that a clear peak is not observed when measurement is conducted using a θ/2θ scan by an out-of-plane method, which is an X-ray diffraction (XRD) measurement method. That is, it is found by the X-ray diffraction measurement that there are no alignment in the a-b plane direction and no alignment in the c-axis direction in the measured areas.

In an electron diffraction pattern of the CAC-OS which is obtained by irradiation with an electron beam with a probe diameter of 1 nm (also referred to as a nanometer-sized electron beam), a ring-like region with high luminance and a plurality of bright spots in the ring-like region are observed. Therefore, the electron diffraction pattern indicates that the crystal structure of the CAC-OS includes an nc (nano-crystal) structure with no alignment in the plan-view direction and the cross-sectional direction.

Moreover, for example, it can be checked by EDX mapping obtained using energy dispersive X-ray spectroscopy (EDX) that the CAC-OS in the In—Ga—Zn oxide has a composition in which regions including $GaO_{X3}$ as a main component and regions including $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, the region containing $GaO_{X3}$ or the like as a main component and the region containing $In_{X2}Zn_{Y2}O_{Z2}$ or $InO_{X1}$ as a main component are separated to form a mosaic pattern.

The conductivity of the region containing $In_{X2}Zn_{Y2}O_{Z2}$ or $InO_{X1}$ as a main component is higher than that of the region containing $GaO_{X3}$ or the like as a main component. In other words, when carriers flow through the regions including $In_{X2}Zn_{Y2}O_{Z2}$ or $InO_{X1}$ as a main component, the conductivity of a metal oxide is exhibited. Accordingly, when the regions including $In_{X2}Zn_{Y2}O_{Z2}$ or $InO_{X1}$ as a main component are distributed in a metal oxide like a cloud, high field-effect mobility (μ) can be achieved.

By contrast, the insulating property of the region containing $GaO_{X2}$ or the like as a main component is superior to that of the region containing $In_{X2}Zn_{Y2}O_{Z2}$ or $InO_{X1}$ as a main component. In other words, when regions including $GaO_{X3}$ or the like as a main component are distributed in a metal oxide, leakage current can be inhibited and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current ($I_{on}$) and high field-effect mobility (μ) can be achieved.

A semiconductor element using a CAC-OS has high reliability. Thus, the CAC-OS is suitably used in a variety of semiconductor devices typified by a display.

Since a transistor including a CAC-OS in a semiconductor layer has high field-effect mobility and high driving capability, the use of the transistor in a driver circuit, typically a scan line driver circuit that generates a gate signal, enables a display device with a narrow frame width (also referred to as a narrow bezel) to be provided. Furthermore, with the use of the transistor in a signal line driver circuit that is included in a display device (particularly in a demultiplexer connected to an output terminal of a shift register included in a signal line driver circuit), the display device connected to less number of wirings can be provided.

Furthermore, unlike a transistor including low-temperature polysilicon, the transistor including a CAC-OS in the semiconductor layer does not need a laser crystallization step. Thus, the manufacturing cost of a display device can be reduced, even when the display device is formed using a large substrate. In addition, the transistor including a CAC-OS in the semiconductor layer is preferably used for a driver circuit and a display unit in a large display device having high resolution such as ultra-high definition ("4K resolution", "4K2K", and "4K") or super high definition ("8K resolution", "8K4K", and "8K"), in which case writing can be performed in a short time and display defects can be reduced.

Alternatively, silicon may be used for a semiconductor in which a channel of a transistor is formed. As the silicon, amorphous silicon may be used but silicon having crystallinity is preferably used. For example, microcrystalline silicon, polycrystalline silicon, or single-crystal silicon are preferably used. In particular, polycrystalline silicon can be formed at a temperature lower than that for single crystal silicon and has higher field-effect mobility and higher reliability than amorphous silicon.

Conductive Layer

Examples of materials that can be used for conductive layers of a variety of wirings and electrodes and the like included in the display device in addition to a gate, a source, and a drain of a transistor include metals such as aluminum, titanium, chromium, nickel, copper, yttrium, zirconium, molybdenum, silver, tantalum, and tungsten and an alloy containing such a metal as its main component. A single-layer structure or stacked-layer structure including a film containing any of these materials can be used. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which an aluminum film or a copper film is stacked over a titanium film or a titanium nitride film and a titanium film or a titanium nitride film is formed thereover, a three-layer structure in which an aluminum film or a copper film is stacked over a molybdenum film or a molybdenum nitride film and a molybdenum film or a molybdenum nitride film is formed thereover, and the like can be given. Note that an oxide such as indium oxide, tin oxide, or zinc oxide may be used. Furthermore, copper containing manganese is preferably used because it increases controllability of a shape by etching.

Insulating Layer

Examples of an insulating material that can be used for the insulating layers include, in addition to a resin such as acrylic or epoxy and a resin having a siloxane bond, an inorganic insulating material such as silicon oxide, silicon oxynitride, silicon nitride oxide, silicon nitride, or aluminum oxide.

The light-emitting element is preferably provided between a pair of insulating films with low water permeability. In that case, impurities such as water can be inhibited from entering the light-emitting element, and thus a decrease in device reliability can be inhibited.

Examples of the insulating film with low water permeability include a film containing nitrogen and silicon, such as a silicon nitride film and a silicon nitride oxide film, and a film containing nitrogen and aluminum, such as an aluminum nitride film. Alternatively, a silicon oxide film, a silicon oxynitride film, an aluminum oxide film, or the like may be used.

For example, the moisture vapor transmission rate of the insulating film with low water permeability is lower than or equal to $1\times10^{-5}$ [g/(m$^2$·day)], preferably lower than or equal to $1\times10^{-6}$ [g/(m$^2$·day)], further preferably lower than or equal to $1\times10^{-7}$ [g/(m$^2$·day)], still further preferably lower than or equal to $1\times10^{-8}$ [g/(m$^2$·day)].

The above is the description of the components.

At least part of the structure examples, the drawings corresponding thereto, and the like exemplified in this embodiment can be implemented in combination with the other structure examples, the other drawings, and the like as appropriate.

At least part of this embodiment can be implemented in combination with the other embodiments described in this specification as appropriate.

Embodiment 2

The second wiring (the wiring 14) described as an example in Embodiment 1 can be used not only for a display device but also for a variety of semiconductor devices. That is, the second wiring can be favorably used also for a semiconductor circuit that is provided over a single crystal substrate, a glass substrate, or a film substrate and does not have a display function.

A TEG (Test Element Group) is known as an element for evaluating electrical characteristics and the like of a fabricated element, a fabricated circuit, or the like in research and development, production management, and the like of a variety of semiconductor devices including display devices. Such a TEG includes a terminal that is to be touched by a measurement probe. In many cases, the terminal has a sufficiently larger area than an element to be measured and thus is easily influenced by ESD. Thus, the electrical characteristics of the element to be measured are changed by the influence of ESD in some cases.

In this embodiment, an example in the case where the wiring 14 described as an example in Embodiment 1 is used for a TEG is described.

Figure 14A:
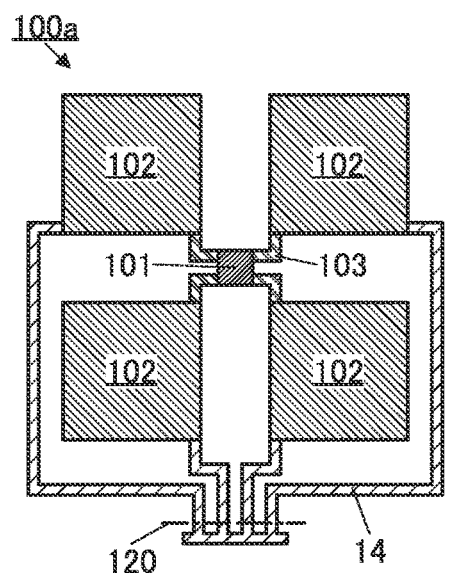
FIG. 14A to FIG. 14E are diagrams illustrating structure examples of a TEG.

FIG. 14A is a schematic top view of a TEG 100a. The TEG 100a includes an element to be measured 101, a plurality of terminals 102, wirings 103, and the wiring 14.

As the element to be measured 101, a variety of elements or a circuit can be used. For example, a transistor, a resistor, a capacitor, a wiring, or a circuit including one or more of these can be given. Furthermore, as the element to be measured 101, a variety of elements for measurement purposes, such as an evaluation element for contact resistance and an element for evaluating a breakdown voltage, can be used.

Here, four terminals 102 electrically connected to the element to be measured 101. For example, in the case where a transistor is used as the element to be measured 101, the four terminals 102 correspond to terminals electrically connected to a first gate electrode, a second gate electrode, a source electrode, and a drain electrode of the transistor through the wirings 103.

The wiring 14 is electrically connected to the four terminals 102. Here, the wiring 14 is cut by a cut line 120 illustrated in FIG. 14A, so that the four terminals 102 can be electrically isolated. As illustrated in FIG. 14A, to make all of the terminals 102 electrically isolated by one-time cutting, it is preferable that parts of the wiring 14 be arranged parallel to each other (also referred to as a comb-like portion) in the top surface shape. Furthermore, although the example in which the wiring 14 has a straight shape is shown here, for example, at least part of the wiring 14 may have a gentle meandering shape, an S shape, or a plurality of S shapes connected to each other (also referred to as a pleated shape).

The cutting of the wiring 14 is preferably performed right before the measurement. Although the method for cutting the wiring 14 is not particularly limited, a laser cutter can be favorably used.

When the plurality of terminals 102 included in the TEG 100a are electrically connected to each other by the wiring 14 until right before the measurement, an influence by ESD generated due to electrification of a substrate during the manufacturing steps or a manufactured substrate is reduced, so that a breakdown of the element to be measured 101 or a change in electrical characteristics can be favorably inhibited.

Figure 14B:
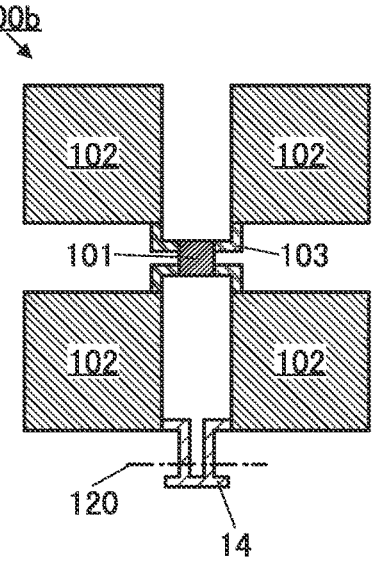

FIG. 14B shows a TEG 100b in which two out of the four terminals 102 are electrically connected to each other by the wiring 14. Like this, a structure may be used in which not all the terminals 102 are electrically connected but only the terminals 102 that are electrically connected to electrodes or the like having a low withstand voltage in the element to be measured 101 are selected and electrically connected to each other by the wiring 14 depending on the structure of the element to be measured 101.

Figure 14C:
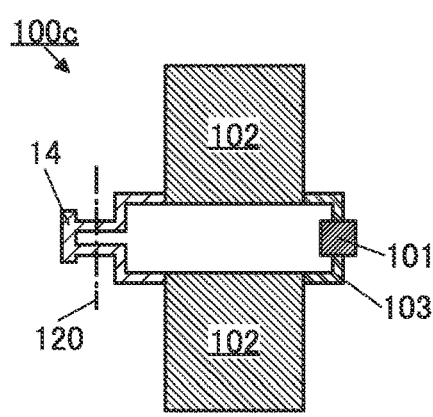
Figure 14D:
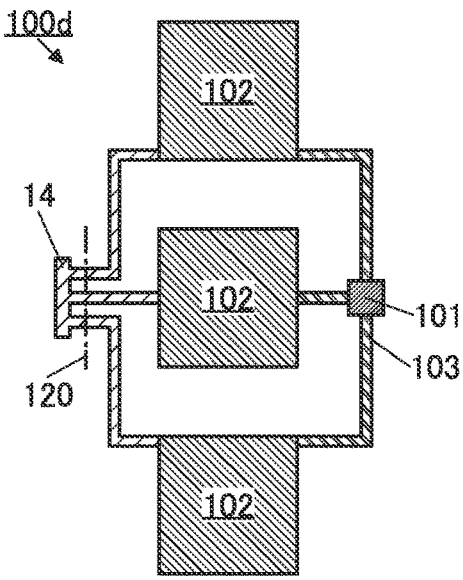

FIG. 14C shows a TEG 100c including the element to be measured 101 having two terminals, as an example. FIG. 14D shows an example of a TEG 100d including the element to be measured 101 having three terminals.

Figure 14E:
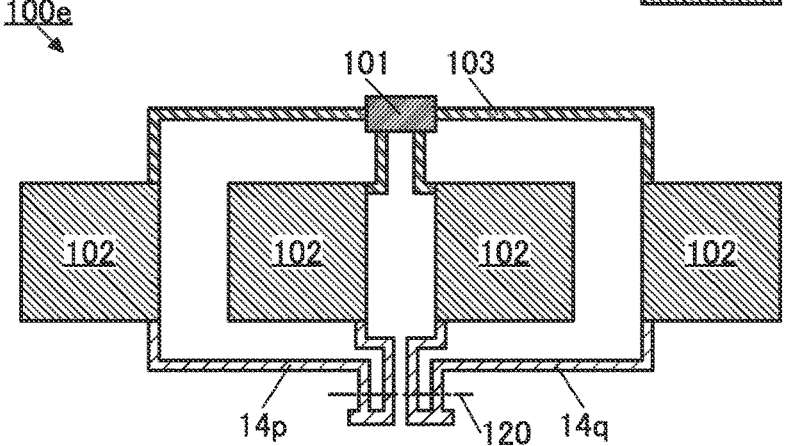

FIG. 14E shows an example of a TEG 100e including a wiring 14p that electrically connects two of the four terminals 102 and a wiring 14q that electrically connects the other two. As illustrated in FIG. 14E, in the case where two or more wirings 14 that are electrically insulated are included, the top surface shape in which the wirings 14 can be cut at a time is preferable.

Note that the number of the terminals 102 is not limited to the above, and five or more terminals may be included depending on the structure of the element to be measured 101.

At least part of this embodiment can be implemented in combination with the other embodiments described in this specification as appropriate.

Embodiment 3

In this embodiment, a display device that includes the semiconductor device of one embodiment of the present invention is described with reference to FIG. 15.

Figure 15A:
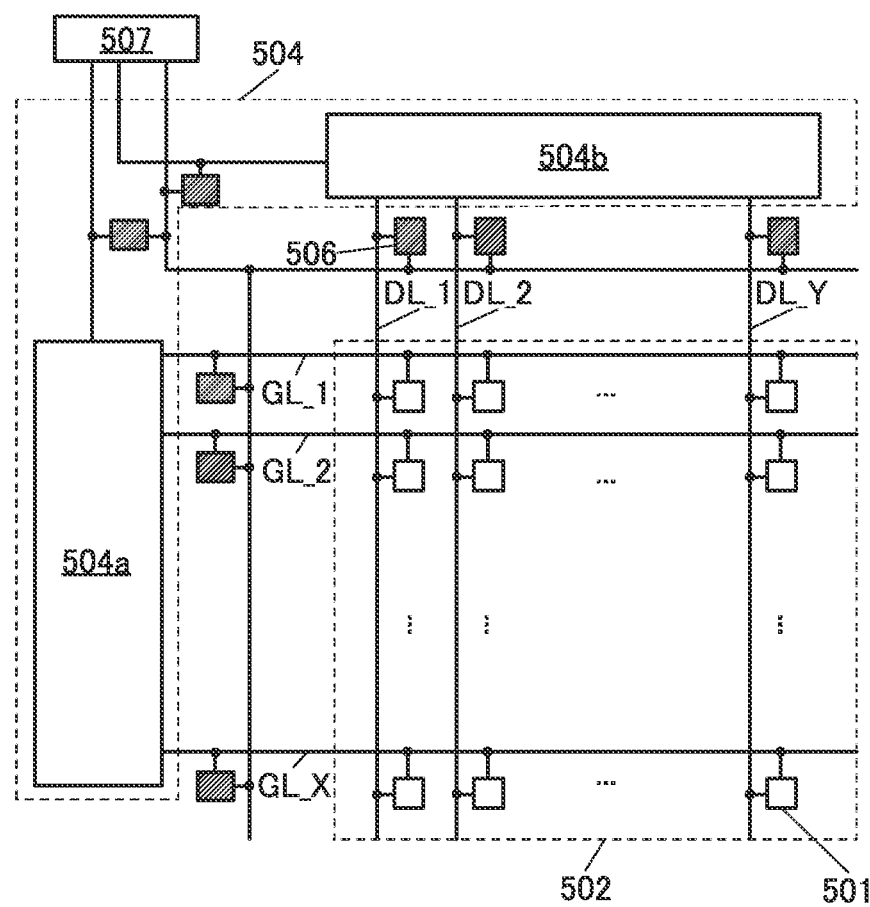
FIG. 15A is a block diagram of a display device.

A display device illustrated in FIG. 15A includes a pixel portion 502, a driver circuit portion 504, protection circuits 506, and a terminal portion 507. Note that a structure in which the protection circuits 506 are not provided may be employed.

The transistor of one embodiment of the present invention can be used as transistors included in the pixel portion 502 and the driver circuit portion 504. The transistor of one embodiment of the present invention may also be used in the protection circuits 506.

The pixel portion 502 includes a plurality of pixel circuits 501 that drive a plurality of display elements arranged in X rows and Y columns (X and Y each independently represent a natural number of 2 or more).

The driver circuit portion 504 includes driver circuits such as a gate driver 504a that outputs a scanning signal to gate lines GL_1 to GL_X and a source driver 504b that supplies a data signal to data lines DL_1 to DL_Y. The gate driver 504a includes at least a shift register. The source driver 504b is formed using a plurality of analog switches, for example. Alternatively, the source driver 504b may be formed using a shift register or the like.

The terminal portion 507 refers to a portion provided with terminals for inputting power, control signals, image signals, and the like to the display device from external circuits.

The protection circuit 506 is a circuit that, when a potential out of a certain range is applied to a wiring to which the protection circuit 506 is connected, establishes continuity between the wiring and another wiring. The protection circuit 506 illustrated in FIG. 15A is connected to a variety of wirings such as the gate lines GL that are wirings between the gate driver 504a and the pixel circuits 501 and the data lines DL that are wirings between the source driver 504b and the pixel circuits 501, for example. Note that the protection circuits 506 are hatched in FIG. 15A to distinguish the protection circuits 506 from the pixel circuits 501.

The gate driver 504a and the source driver 504b may be provided over a substrate over which the pixel portion 502 is provided, or a substrate where a gate driver circuit or a source driver circuit is separately formed (e.g., a driver circuit board formed using a single crystal semiconductor or a polycrystalline semiconductor) may be mounted on the substrate by COG or TAB (Tape Automated Bonding).

Figure 15B:
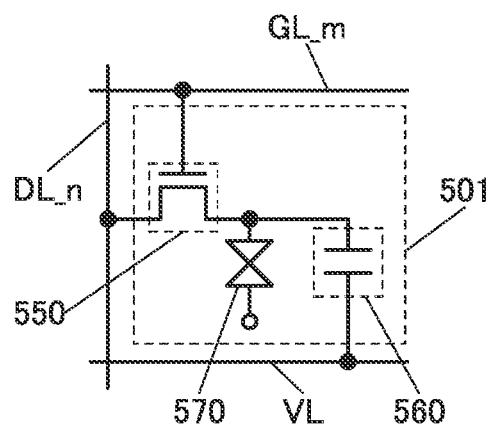
FIG. 15B and FIG. 15C are circuit diagrams of a pixel.
Figure 15C:
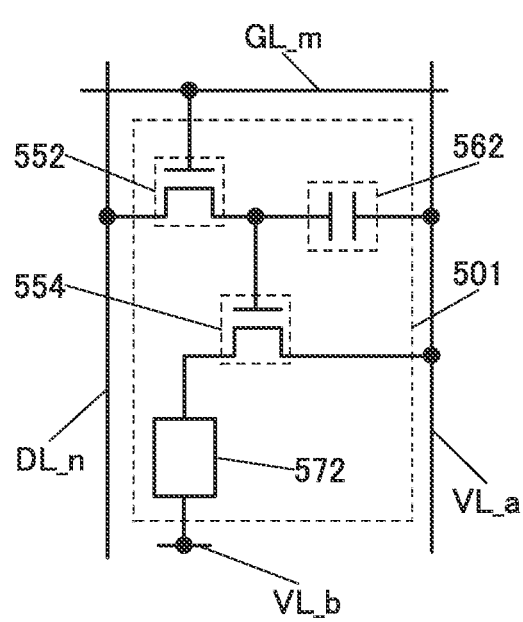

The plurality of pixel circuits 501 illustrated in FIG. 15A can have a configuration illustrated in FIG. 15B or FIG. 15C, for example.

The pixel circuit 501 illustrated in FIG. 15B includes a liquid crystal element 570, a transistor 550, and a capacitor 560. The data line DL_n, the gate line GL_m, a potential supply line VL, and the like are connected to the pixel circuit 501.

The potential of one of a pair of electrodes of the liquid crystal element 570 is set appropriately in accordance with the specifications of the pixel circuit 501. The alignment state of the liquid crystal element 570 is set depending on written data. Note that a common potential may be supplied to one of the pair of electrodes of the liquid crystal element 570 included in each of the plurality of pixel circuits 501. Moreover, a different potential may be supplied to one of the pair of electrodes of the liquid crystal element 570 of the pixel circuit 501 in each row.

The pixel circuit 501 illustrated in FIG. 15C includes a transistor 552 and a transistor 554, a capacitor 562, and a light-emitting element 572. The data line DL_n, the gate line GL_m, a potential supply line VL_a, a potential supply line VL_b, and the like are connected to the pixel circuit 501.

Note that a high power supply potential VDD is supplied to one of the potential supply line VL_a and the potential supply line VL_b, and a low power supply potential VSS is supplied to the other. Current flowing through the light-emitting element 572 is controlled in accordance with a potential applied to a gate of the transistor 554, whereby the luminance of light emitted from the light-emitting element 572 is controlled.

At least part of the structure examples, the drawings corresponding thereto, and the like exemplified in this embodiment can be implemented in combination with the other structure examples, the other drawings, and the like as appropriate.

At least part of this embodiment can be implemented in combination with the other embodiments described in this specification as appropriate.

Embodiment 4

A pixel circuit including a memory for correcting gray levels displayed by pixels and a display device including the pixel circuit are described below. The transistor described in Embodiment 1 can be used as a transistor used in the pixel circuit described below.

Circuit Configuration

Figure 16A:
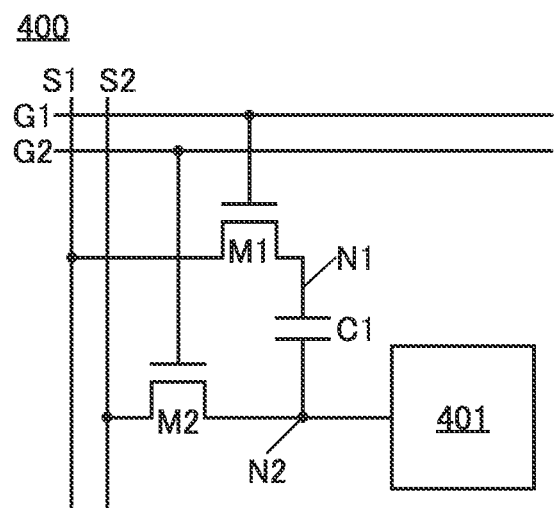
FIG. 16A, FIG. 16C, and FIG. 16D are circuit diagrams of a display device.

FIG. 16A is a circuit diagram of a pixel circuit 400. The pixel circuit 400 includes a transistor M1, a transistor M2, a capacitor C1, and a circuit 401. A wiring S1, a wiring S2, a wiring G1, and a wiring G2 are connected to the pixel circuit 400.

In the transistor M1, a gate is connected to the wiring G1, one of a source and a drain is connected to the wiring S1, and the other is connected to one electrode of the capacitor C1. In the transistor M2, a gate is connected to the wiring G2, one of a source and a drain is connected to the wiring S2, and the other is connected to the other electrode of the capacitor C1 and the circuit 401.

The circuit 401 is a circuit including at least one display element. Any of a variety of elements can be used as the display element, and typically, a light-emitting element such as an organic EL element or an LED element, a liquid crystal element, a MEMS (Micro Electro Mechanical Systems) element, or the like can be used.

A node connecting the transistor M1 and the capacitor C1 is denoted as a node N1, and a node connecting the transistor M2 and the circuit 401 is denoted as a node N2.

In the pixel circuit 400, the potential of the node N1 can be retained when the transistor M1 is turned off. The potential of the node N2 can be retained when the transistor M2 is turned off. When a predetermined potential is written to the node N1 through the transistor M1 with the transistor M2 being in an off state, the potential of the node N2 can be changed in accordance with displacement of the potential of the node N1 owing to capacitive coupling through the capacitor C1.

Here, the transistor using an oxide semiconductor, which is described in Embodiment 1, can be used as one or both of the transistor M1 and the transistor M2. Accordingly, owing to an extremely low off-state current, the potentials of the node N1 and the node N2 can be retained for a long time. Note that in the case where the period in which the potential of each node is retained is short (specifically, the case where the frame frequency is higher than or equal to 30 Hz, for example), a transistor using a semiconductor such as silicon may be used.

Driving Method Example

Figure 16B:
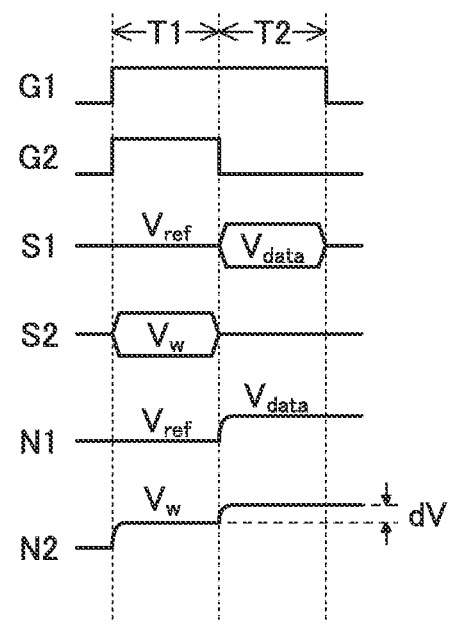
FIG. 16B is a timing chart.

Next, an example of a method for operating the pixel circuit 400 is described with reference to FIG. 16B. FIG. 16B is a timing chart of the operation of the pixel circuit 400. Note that for simplification of description, the influence of various kinds of resistance such as wiring resistance, parasitic capacitance of a transistor, a wiring, or the like, the threshold voltage of the transistor, and the like is not taken into account here.

In the operation shown in FIG. 16B, one frame period is divided into a period T1 and a period T2. The period T1 is a period in which a potential is written to the node N2, and the period T2 is a period in which a potential is written to the node N1.

Period T1

In the period T1, a potential for turning on the transistor is supplied to both the wiring G1 and the wiring G2. In addition, a potential $V_{ref}$ that is a fixed potential is supplied to the wiring S1, and a first data potential $V_w$ is supplied to the wiring S2.

The potential $V_{ref}$ is supplied from the wiring S1 to the node N1 through the transistor M1. The first data potential $V_w$ is supplied from the wiring S2 to the node N2 through the transistor M2. Accordingly, a potential difference $V_w - V_{ref}$ is retained in the capacitor C1.

Period T2

Next, in the period T2, a potential for turning on the transistor M1 is supplied to the wiring G1, and a potential for turning off the transistor M2 is supplied to the wiring G2. A second data potential $V_{data}$ is supplied to the wiring S1. The wiring S2 may be supplied with a predetermined constant potential or brought into a floating state.

The second data potential $V_{data}$ is supplied from the wiring S1 to the node N1 through the transistor M1. At this time, capacitive coupling due to the capacitor C1 changes the potential of the node N2 in accordance with the second data potential $V_{data}$ by a potential dV. That is, a potential that is the sum of the first data potential $V_w$ and the potential dV is input to the circuit 401. Note that although dV is shown as a positive value in FIG. 16B, dV may be a negative value. That is, the second data potential $V_{data}$ may be lower than the potential $V_{ref}$.

Here, the potential dV is roughly determined by the capacitance of the capacitor C1 and the capacitance of the circuit 401. When the capacitance of the capacitor C1 is sufficiently larger than the capacitance of the circuit 401, the potential dV is a potential close to the second data potential $V_{data}$.

In the above manner, the pixel circuit 400 can generate a potential to be supplied to the circuit 401 including the display element, by combining two kinds of data signals; hence, a gray level can be corrected in the pixel circuit 400.

The pixel circuit 400 can also generate a potential exceeding the maximum potential that can be supplied to the wiring S1 and the wiring S2. For example, in the case where a light-emitting element is used, high-dynamic range (HDR) display or the like can be performed. In the case where a liquid crystal element is used, overdriving or the like can be achieved.

Application Examples

Example Using Liquid Crystal Element

Figure 16C:
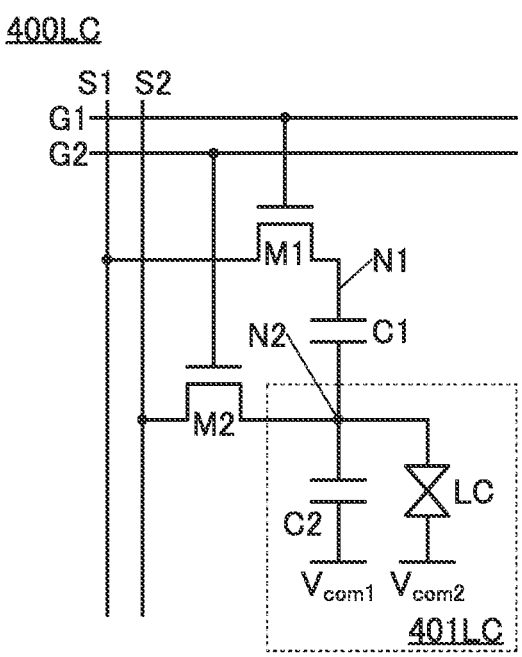

A pixel circuit 400LC illustrated in FIG. 16C includes a circuit 401LC. The circuit 401LC includes a liquid crystal element LC and a capacitor C2.

In the liquid crystal element LC, one electrode is connected to the node N2 and one electrode of the capacitor C2, and the other electrode is connected to a wiring supplied with a potential $V_{com2}$. The other electrode of the capacitor C2 is connected to a wiring supplied with a potential $V_{com1}$.

The capacitor C2 functions as a storage capacitor. Note that the capacitor C2 can be omitted when not needed.

In the pixel circuit 400LC, a high voltage can be supplied to the liquid crystal element LC; thus, high-speed display can be performed by overdriving or a liquid crystal material with a high driving voltage can be employed, for example. Moreover, by supply of a correction signal to the wiring S1 or the wiring S2, a gray level can be corrected in accordance with the operating temperature, the deterioration state of the liquid crystal element LC, or the like.

Example Using Light-Emitting Element

Figure 16D:
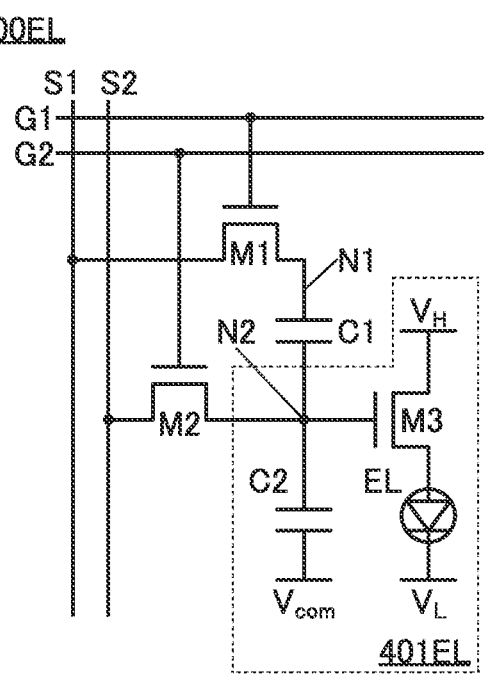

A pixel circuit 400EL illustrated in FIG. 16D includes a circuit 401EL. The circuit 401EL includes a light-emitting element EL, a transistor M3, and the capacitor C2.

In the transistor M3, a gate is connected to the node N2 and one electrode of the capacitor C2, one of a source and a drain is connected to a wiring supplied with a potential $V_H$, and the other is connected to one electrode of the light-emitting element EL. The other electrode of the capacitor C2 is connected to a wiring supplied with a potential $V_{com}$. The other electrode of the light-emitting element EL is connected to a wiring supplied with a potential $V_L$.

The transistor M3 has a function of controlling a current to be supplied to the light-emitting element EL. The capacitor C2 functions as a storage capacitor. The capacitor C2 can be omitted when not needed.

Note that although the structure in which the anode side of the light-emitting element EL is connected to the transistor M3 is described here, the transistor M3 may be connected to the cathode side. In that case, the values of the potential $V_H$ and the potential $V_L$ can be appropriately changed.

In the pixel circuit 400EL, a large amount of current can flow through the light-emitting element EL when a high potential is applied to the gate of the transistor M3, which enables HDR display, for example. Moreover, a variation in the electrical characteristics of the transistor M3 and the light-emitting element EL can be corrected by supply of a correction signal to the wiring S1 or the wiring S2.

Note that the configuration is not limited to the circuits shown in FIG. 16C and FIG. 16D, and a configuration to which a transistor, a capacitor, or the like is further added may be employed.

At least part of this embodiment can be implemented in combination with the other embodiments described in this specification as appropriate.

Embodiment 5

In this embodiment, a display module that can be fabricated using one embodiment of the present invention is described.

Figure 17A:
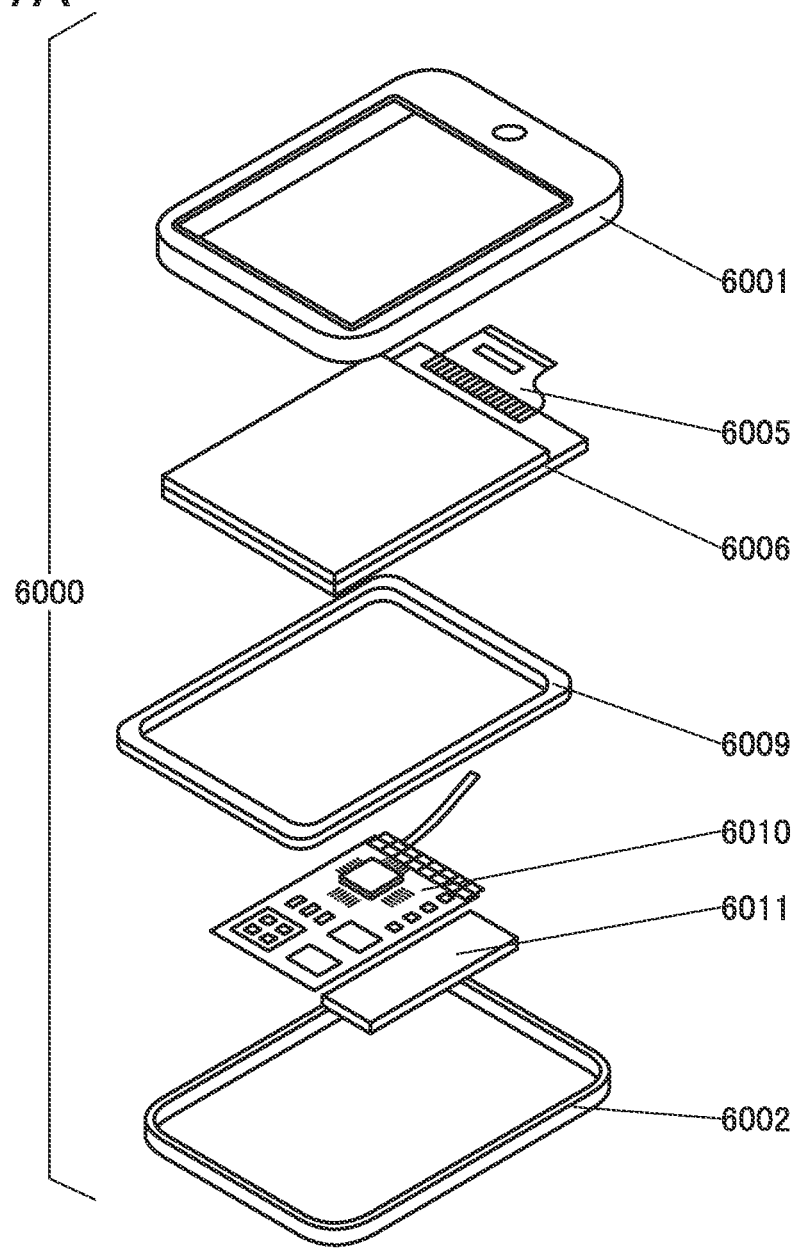
FIG. 17A and FIG. 17B are diagrams illustrating structure examples of a display module.

In a display module 6000 illustrated in FIG. 17A, a display device 6006 to which an FPC 6005 is connected, a frame 6009, a printed circuit board 6010, and a battery 6011 are provided between an upper cover 6001 and a lower cover 6002.

A display device fabricated using one embodiment of the present invention can be used as the display device 6006, for example. With the display device 6006, a display module with extremely low power consumption can be achieved.

The shape and size of the upper cover 6001 and the lower cover 6002 can be changed as appropriate in accordance with the size of the display device 6006.

The display device 6006 may have a function of a touch panel.

The frame 6009 may have a function of protecting the display device 6006, a function of blocking electromagnetic waves generated by the operation of the printed circuit board 6010, a function of a heat dissipation plate, or the like.

The printed circuit board 6010 includes a power supply circuit, a signal processing circuit for outputting a video signal and a clock signal, a battery control circuit, and the like.

Figure 17B:
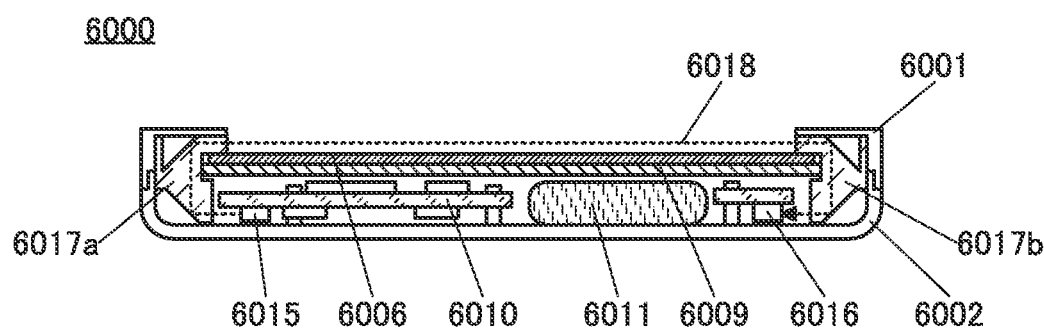

FIG. 17B is a schematic cross-sectional view of the display module 6000 having an optical touch sensor.

The display module 6000 includes a light-emitting portion 6015 and a light-receiving portion 6016 that are provided on the printed circuit board 6010. Furthermore, a pair of light guide portions (a light guide portion 6017a and a light guide portion 6017b) is provided in a region surrounded by the upper cover 6001 and the lower cover 6002.

The display device 6006 overlaps the printed circuit board 6010 and the battery 6011 with the frame 6009 therebetween. The display device 6006 and the frame 6009 are fixed to the light guide portion 6017a and the light guide portion 6017b.

Light 6018 emitted from the light-emitting portion 6015 travels over the display device 6006 through the light guide portion 6017a and reaches the light-receiving portion 6016 through the light guide portion 6017b. For example, blocking of the light 6018 by a sensing target such as a finger or a stylus enables detection of touch operation.

A plurality of light-emitting portions 6015 are provided along two adjacent sides of the display device 6006, for example. A plurality of light-receiving portions 6016 are provided at the positions on the opposite side of the light-emitting portions 6015. Accordingly, information about the position of touch operation can be obtained.

As the light-emitting portion 6015, a light source such as an LED element can be used, for example, and it is particularly preferable to use a light source emitting infrared rays. As the light-receiving portion 6016, a photoelectric element that receives light emitted from the light-emitting portion 6015 and converts it into an electric signal can be used. A photodiode that can receive infrared rays can be suitably used.

With the use of the light guide portion 6017a and the light guide portion 6017b which transmit the light 6018, the light-emitting portion 6015 and the light-receiving portion 6016 can be placed under the display device 6006, and a malfunction of the touch sensor due to external light reaching the light-receiving portion 6016 can be inhibited. Particularly when a resin that absorbs visible light and transmits infrared rays is used, a malfunction of the touch sensor can be inhibited more effectively.

At least part of this embodiment can be implemented in combination with the other embodiments described in this specification as appropriate.

Embodiment 6

In this embodiment, examples of an electronic device for which the display device of one embodiment of the present invention can be used are described.

Figure 18A:
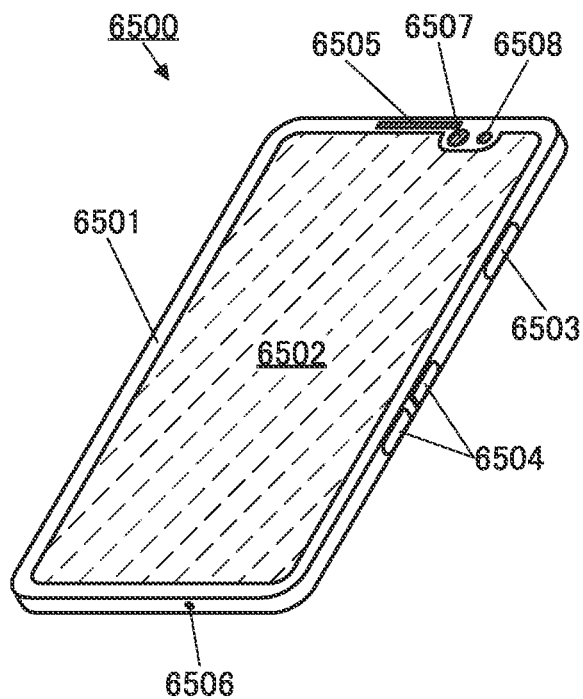
FIG. 18A to FIG. 18C are diagrams illustrating structure examples of an electronic device.

An electronic device 6500 illustrated in FIG. 18A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used in the display portion 6502.

The display portion 6502 has a notch, and the camera 6507 and the light source 6508 are provided to be engaged with the notch. With such a structure, an area occupied by the display portion 6502 with respect to the housing 6501 can be large.

Figure 18B:
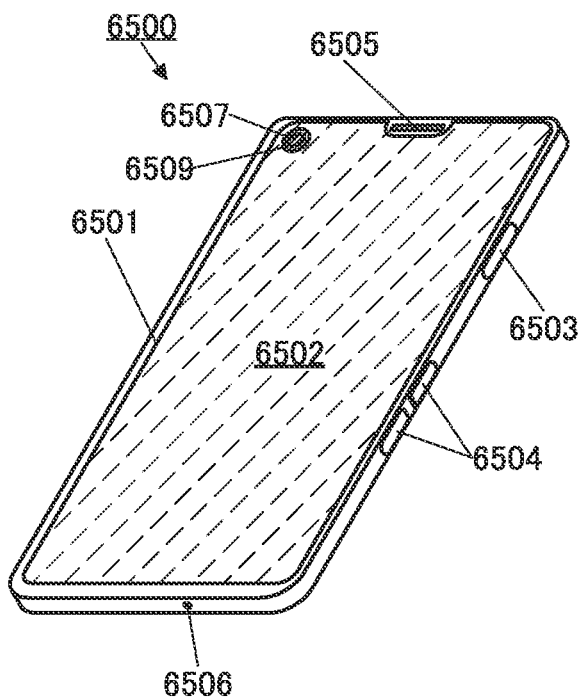

Moreover, FIG. 18B shows an example in which the display portion 6502 has an opening, and the camera 6507 and an annular light source 6509 surrounding the camera 6507 are placed in the opening. Furthermore, the speaker 6505 is provided to be engaged with the notch of the display portion 6502. The display portion 6502 may be used as a light source that illuminates a subject. With such a structure, an area occupied by the display portion 6502 with respect to the housing 6501 can be large.

Figure 18C:
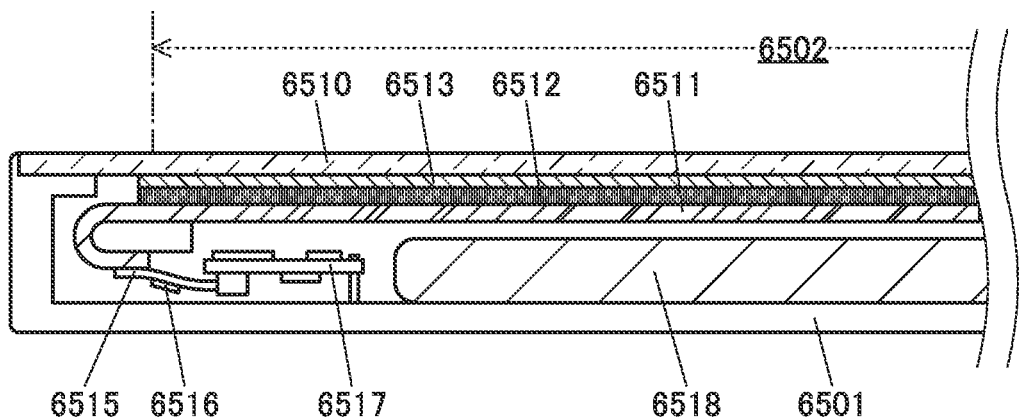

FIG. 18C is a schematic cross-sectional view including an end portion of the housing 6501 on the microphone 6506 side.

A protective member 6510 having a light-transmitting property is provided on the display surface side of the housing 6501, and a display panel 6511, an optical member 6512, a touch sensor panel 6513, a printed circuit board 6517, a battery 6518, and the like are provided in a space surrounded by the housing 6501 and the protective member 6510.

The display panel 6511, the optical member 6512, and the touch sensor panel 6513 are fixed to the protective member 6510 with a bonding layer not illustrated.

Part of the display panel 6511 is bent in a region outside the display portion 6502. An FPC 6515 is connected to the bent part. An IC 6516 is mounted on the FPC 6515. The FPC 6515 is connected to a terminal provided for the printed circuit board 6517.

A flexible display panel of one embodiment of the present invention can be used as the display panel 6511. Thus, an extremely lightweight electronic device can be achieved. Furthermore, since the display panel 6511 is extremely thin, the battery 6518 with a high capacity can be provided without an increase in the thickness of the electronic device. Moreover, part of the display panel 6511 is bent to provide a connection portion with the FPC 6515 on the back side of the pixel portion, whereby an electronic device with a narrow bezel can be obtained.

At least part of this embodiment can be implemented in combination with the other embodiments described in this specification as appropriate.

Embodiment 7

In this embodiment, electronic devices each including a display device manufactured using one embodiment of the present invention are described.

Electronic devices exemplified below include a display device of one embodiment of the present invention in a display portion. Thus, the electronic devices achieve high resolution. In addition, the electronic devices can achieve both high resolution and a large screen.

The display portion of the electronic device of one embodiment of the present invention can display an image with a resolution of, for example, full high definition, 4K2K, 8K4K, 16K8K, or higher.

Examples of the electronic devices include a digital camera, a digital video camera, a digital photo frame, a mobile phone, a portable game console, a portable information terminal, and an audio reproducing device, in addition to electronic devices with a relatively large screen, such as a television device, a laptop personal computer, a monitor device, digital signage, a pachinko machine, or a game machine.

The electronic device using one embodiment of the present invention can be incorporated along a flat surface or a curved surface of an inside wall or an outside wall of a house or a building, an interior or an exterior of a car, or the like.

Figure 19A:
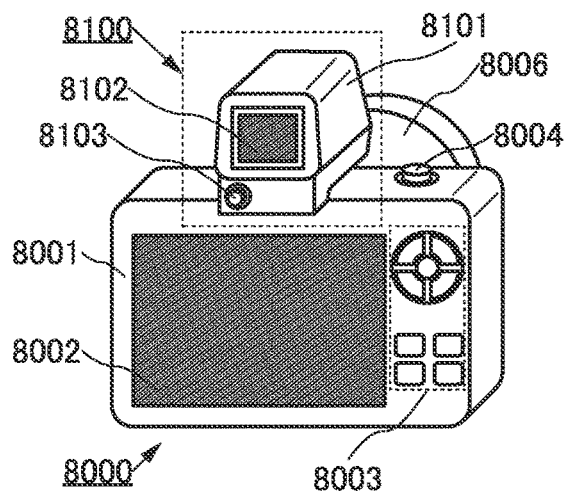
FIG. 19A to FIG. 19E are diagrams illustrating structure examples of an electronic device.

FIG. 19A is a diagram showing appearance of a camera 8000 to which a finder 8100 is attached.

The camera 8000 includes a housing 8001, a display portion 8002, operation buttons 8003, a shutter button 8004, and the like. A detachable lens 8006 is attached to the camera 8000.

Note that the lens 8006 and the housing may be integrated with each other in the camera 8000.

The camera 8000 can take images by the press of the shutter button 8004 or touch on the display portion 8002 serving as a touch panel.

The housing 8001 includes a mount including an electrode, so that, in addition to the finder 8100, a stroboscope or the like can be connected to the housing.

The finder 8100 includes a housing 8101, a display portion 8102, a button 8103, and the like.

The housing 8101 is attached to the camera 8000 with a mount engaging with a mount of the camera 8000. The finder 8100 can display an image or the like received from the camera 8000 on the display portion 8102.

The button 8103 serves as a power button or the like.

The display portion 8002 of the camera 8000 and the display portion 8102 of the finder 8100 can use the display device of one embodiment of the present invention. Note that a finder may be incorporated in the camera 8000.

Figure 19B:
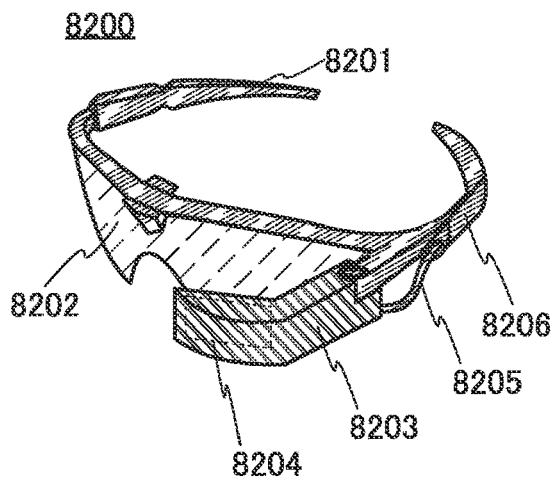

FIG. 19B is a diagram showing appearance of a head-mounted display 8200.

The head-mounted display 8200 includes a mounting portion 8201, a lens 8202, a main body 8203, a display portion 8204, a cable 8205, and the like. A battery 8206 is incorporated in the mounting portion 8201.

The cable 8205 supplies electric power from the battery 8206 to the main body 8203. The main body 8203 includes a wireless receiver or the like and can display received image data on the display portion 8204. The main body 8203 is provided with a camera, and data on the movement of the user's eyeball and eyelid can be used as an input means.

The mounting portion 8201 may include a plurality of electrodes capable of sensing current flowing in response to the movement of the user's eyeball in a position in contact with the user to achieve a function of recognizing the user's sight line. A function of monitoring the user's pulse with the use of current flowing through the electrodes may be achieved. The mounting portion 8201 may include various sensors such as a temperature sensor, a pressure sensor, and an acceleration sensor to have a function of displaying the user's biological information on the display portion 8204 or a function of changing an image displayed on the display portion 8204 in accordance with the movement of the user's head.

The display portion 8204 can use the display device of one embodiment of the present invention.

Figure 19C:
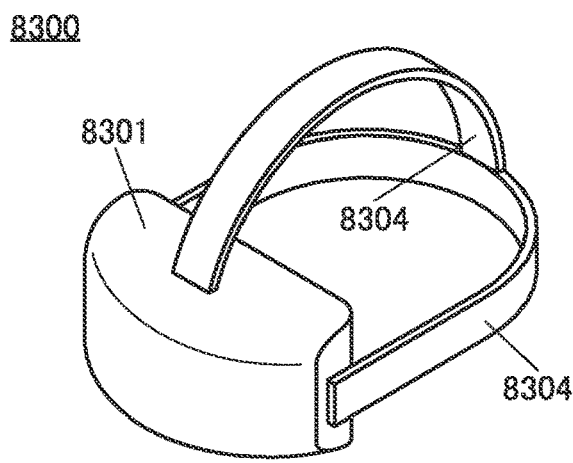
Figure 19D:
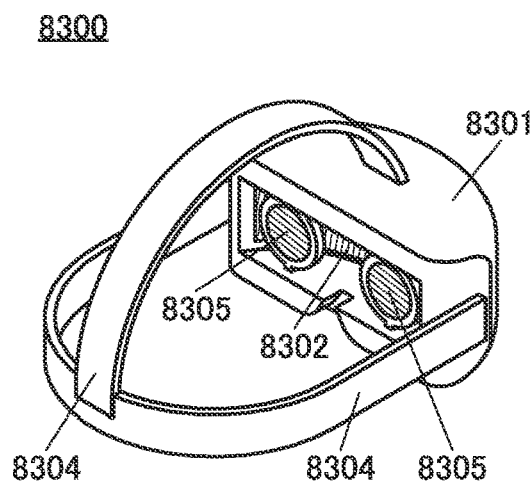
Figure 19E:
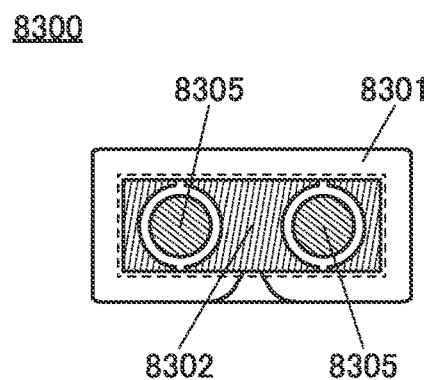

FIG. 19C, FIG. 19D, and FIG. 19E are diagrams showing appearance of a head-mounted display 8300. The head-mounted display 8300 includes a housing 8301, a display portion 8302, a band-shaped fixing unit 8304, and a pair of lenses 8305.

A user can see display on the display portion 8302 through the lenses 8305. Note that the display portion 8302 is preferably curved and placed, in which case the user can feel a high realistic sensation. When another image displayed in a different region of the display portion 8302 is viewed through the lenses 8305, three-dimensional display using parallax or the like can also be performed. Note that the configuration is not limited to that in which one display portion 8302 is provided, and two display portions 8302 may be provided so that one display portion is provided for one eye of the user.

Note that the display device of one embodiment of the present invention can be used in the display portion 8302. The display device including the semiconductor device of one embodiment of the present invention has an extremely high resolution; thus, even when an image is magnified using the lenses 8305 as in FIG. 19E, the user does not perceive pixels, and a more realistic image can be displayed.

Electronic devices illustrated in FIG. 20A to FIG. 20G include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 20A to FIG. 20G have a variety of functions. For example, the electronic devices can have a function of displaying a variety of data (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may each include a camera or the like and have a function of taking a still image or a moving image and storing the taken image in a recording medium (external or incorporated in the camera), a function of displaying the taken image on the display portion, or the like.

The details of the electronic devices illustrated in FIG. 20A to FIG. 20G are described below.

Figure 20A:
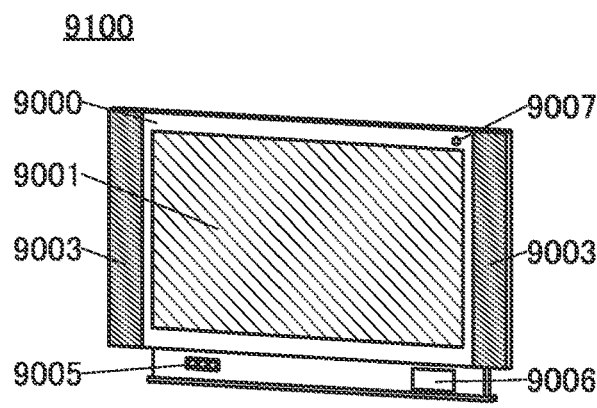
FIG. 20A to FIG. 20G are diagrams illustrating structure examples of an electronic device.

FIG. 20A is a perspective view showing a television device 9100. The television device 9100 can include the display portion 9001 having a large screen size of, for example, 50 inches or more, or 100 inches or more.

Figure 20D:
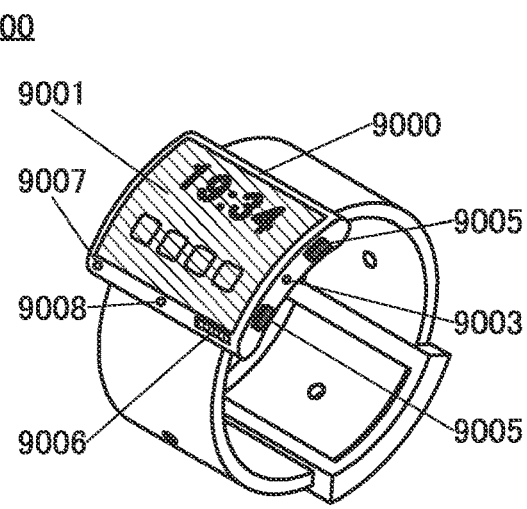
Figure 20B:
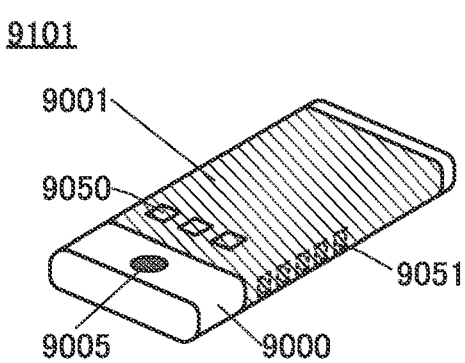

FIG. 20B is a perspective view showing a portable information terminal 9101. For example, the portable information terminal 9101 can be used as a smartphone. Note that the portable information terminal 9101 may be provided with the speaker 9003, the connection terminal 9006, the sensor 9007, or the like. The portable information terminal 9101 can display characters and image information on its plurality of surfaces. FIG. 20B shows an example in which three icons 9050 are displayed. Information 9051 indicated by dashed rectangles can be displayed on another surface of the display portion 9001. Examples of the information 9051 include notification of reception of an e-mail, SNS, or an incoming call, the title and sender of an e-mail, SNS, or the like, the date, the time, remaining battery, and the reception strength of an antenna. Alternatively, the icon 9050 or the like may be displayed in the position where the information 9051 is displayed.

Figure 20E:
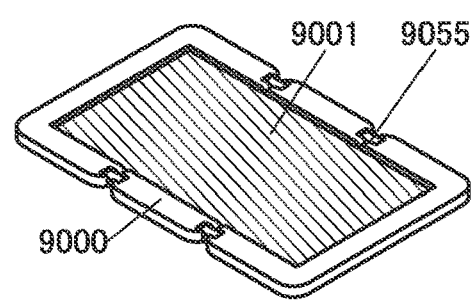
Figure 20C:
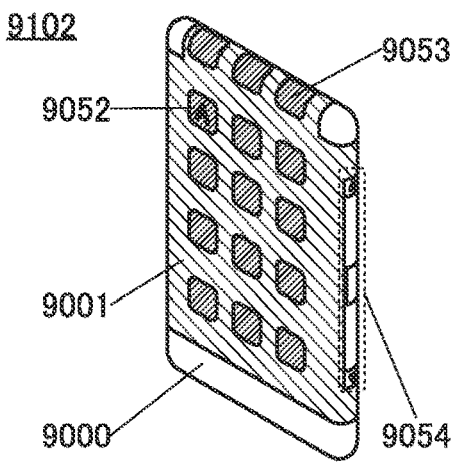

FIG. 20C is a perspective view showing a portable information terminal 9102. The portable information terminal 9102 has a function of displaying information on three or more surfaces of the display portion 9001. Here, an example in which information 9052, information 9053, and information 9054 are displayed on different surfaces is shown. For example, a user can check the information 9053 displayed in a position that can be observed from above the portable information terminal 9102, with the portable information terminal 9102 put in a breast pocket of his/her clothes. The user can see the display without taking out the portable information terminal 9102 from the pocket and decide whether to answer the call, for example.

FIG. 20D is a perspective view showing a watch-type portable information terminal 9200. For example, the portable information terminal 9200 can be used as a smart watch. The display surface of the display portion 9001 is curved and provided, and display can be performed along the curved display surface. Mutual communication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

Figure 20F:
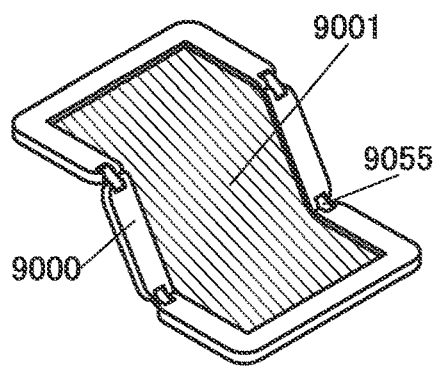
Figure 20G:
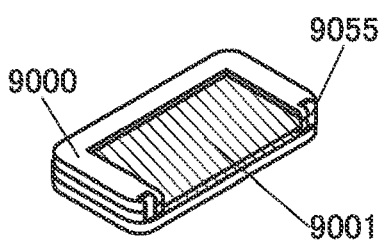

FIG. 20E, FIG. 20F, and FIG. 20G are perspective views showing a foldable portable information terminal 9201. FIG. 20E is a perspective view of an opened state of the portable information terminal 9201, FIG. 20G is a perspective view of a folded state thereof, and FIG. 20F is a perspective view of a state in the middle of change from one of FIG. 20E and FIG. 20G to the other. The portable information terminal 9201 is highly portable in the folded state and is highly browsable in the opened state because of a seamless large display region. The display portion 9001 of the portable information terminal 9201 is supported by three housings 9000 joined by hinges 9055. For example, the display portion 9001 can be folded with a radius of curvature of greater than or equal to 1 mm and less than or equal to 150 mm.

Figure 21A:
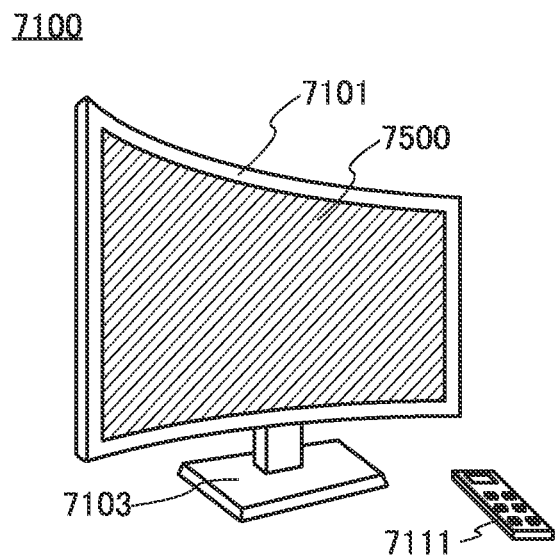
FIG. 21A to FIG. 21D are diagrams illustrating structure examples of an electronic device.

FIG. 21A shows an example of a television device. In a television device 7100, a display portion 7500 is incorporated in a housing 7101. Here, a structure in which the housing 7101 is supported by a stand 7103 is illustrated.

Operation of the television device 7100 illustrated in FIG. 21A can be performed with an operation switch provided in the housing 7101 or a separate remote controller 7111. Alternatively, a touch panel may be used for the display portion 7500, and the television device 7100 may be operated by touch on the touch panel. The remote controller 7111 may be provided with a display portion in addition to operation buttons.

Note that the television device 7100 may include a television receiver and a communication device for a network connection.

Figure 21B:
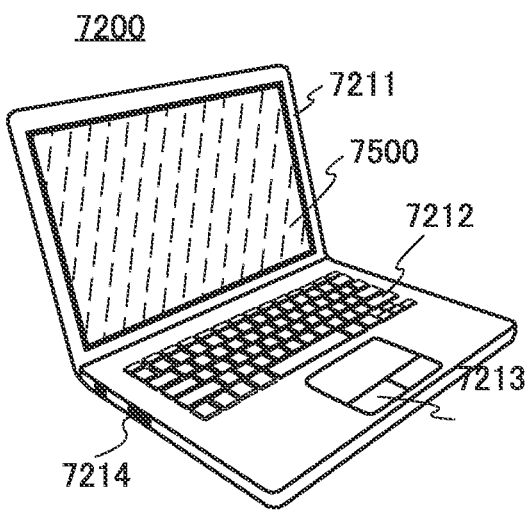

FIG. 21B illustrates a laptop personal computer 7200. The laptop personal computer 7200 includes a housing 7211, a keyboard 7212, a pointing device 7213, an external connection port 7214, and the like. In the housing 7211, the display portion 7500 is incorporated.

Figure 21C:
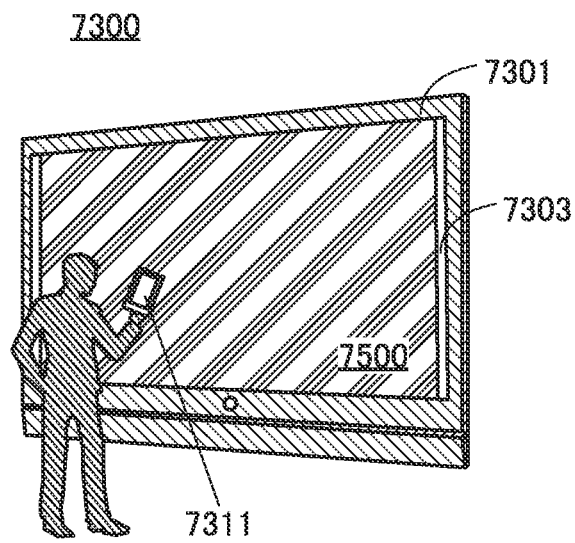
Figure 21D:
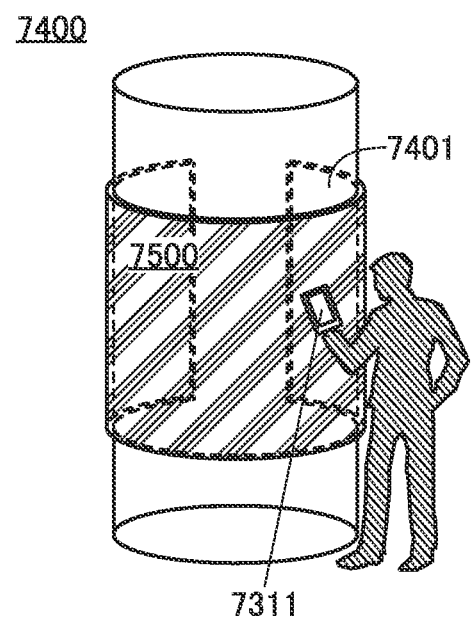

FIG. 21C and FIG. 21D show examples of digital signage.

Digital signage 7300 illustrated in FIG. 21C includes a housing 7301, the display portion 7500, a speaker 7303, and the like. Furthermore, the digital signage can include an LED lamp, operation keys (including a power switch or an operation switch), a connection terminal, a variety of sensors, a microphone, and the like.

FIG. 21D illustrates digital signage 7400 attached to a cylindrical pillar 7401. The digital signage 7400 includes the display portion 7500 provided along a curved surface of the pillar 7401.

The larger display portion 7500 can increase the amount of data that can be provided at a time and attracts more attention, so that the effectiveness of the advertisement can be increased, for example.

A touch panel is preferably used in the display portion 7500 so that the user can operate the digital signage. Thus, the digital signage can be used for not only advertising but also providing information that the user needs, such as route information, traffic information, and an information map of a commercial facility.

As illustrated in FIG. 21C and FIG. 21D, it is preferable that the digital signage 7300 or the digital signage 7400 be capable of working with an information terminal 7311 such as user's smartphone through wireless communication. For example, information of an advertisement displayed on the display portion 7500 can be displayed on a screen of the information terminal 7311. By operation of the information terminal 7311, display on the display portion 7500 can be switched.

It is possible to make the digital signage 7300 or the digital signage 7400 execute a game with the use of the information terminal 7311 as an operation means (controller). Thus, an unspecified number of users can join in and enjoy the game concurrently.

The display device of one embodiment of the present invention can be used in the display portion 7500 in FIG. 21A to FIG. 21D.

The electronic devices of this embodiment each include a display portion; however, one embodiment of the present invention can also be used in an electronic device without a display portion.

REFERENCE NUMERALS

10, 10*a*, 10*b*: display device, 11: display portion, 12, 12*a*, 12*b*: connection terminal, 13, 14, 14*a*, 14*p*, 14*q*, 15, 15*a*: wiring, 13*a*, 13*b*, 13*d*: opening, 13*c*: intersecting portion, 14*b*: processing trace, 16: FPC, 17: connector, 18: connection portion, 19: IC, 20*a*, 20*b*, 20*c*: cut line, 21, 21*a*, 22: substrate, 25: bonding layer, 30, 30*a*, 30*b*, 30*c*, 30*d*, 40, 40*a*, 40*b*: transistor, 31: semiconductor layer, 32, 32*p*, 35, 35*p*, 36, 36*p*, 37, 38, 38*p*, 39: conductive layer, 33, 41, 42, 43, 45, 46: insulating layer, 34: low-resistance region, 50*a*, 50*b*: bent portion, 51: substrate, 52, 53: circuit portion, 54: notch, 100*a*, 100*b*, 100*c*, 100*d*, 100*e*: TEG, 101: element to be measured, 102: terminal, 103: wiring, 120: cut line, 701, 705: substrate, 710: liquid crystal element, 711, 713: conductive layer, 712: liquid crystal, 720: support, 721, 722, 750, 752: transistor, 723: wiring, 725, 726: alignment film, 727: spacer, 730, 734, 741*a*, 741*b*, 741*c*, 744, 746, 770: insulating layer, 732: sealing layer, 736: coloring layer, 738: light-blocking layer, 740: substrate, 741: protective layer, 742, 747, 748: bonding layer, 743: resin layer, 749: protective layer, 755, 756: polarizing plate, 757: light source, 761, 772, 788: conductive layer, 782: light-emitting element, 786: EL layer, 790: capacitor

The invention claimed is:

1. A display device comprising a substrate, a display portion, a connection terminal, a first wiring, and a second wiring,
   wherein the first wiring is electrically connected to the connection terminal and comprises a portion positioned between the connection terminal and the display portion,
   wherein the second wiring is electrically connected to the connection terminal, is positioned between the connection terminal and an end portion of the substrate, and comprises a portion in which an end surface is exposed at the end portion of the substrate,
   wherein the display portion comprises a transistor,
   wherein the transistor comprises a semiconductor layer, a gate insulating layer, and a gate electrode,
   wherein the semiconductor layer and the second wiring comprise a metal oxide,
   wherein the semiconductor layer comprises a first region overlapping with the gate electrode and a second region not overlapping with the gate electrode, and
   wherein the second region and the second wiring have lower resistances than the first region.

2. The display device according to claim 1,
   wherein the semiconductor layer and the second wiring are provided on the same plane and comprise the same metal element.

3. The display device according to claim 1,
   wherein the second wiring has a higher resistance than the first wiring.

4. The display device according to claim 1, further comprising:
   a third wiring electrically connected to the transistor,
   wherein the third wiring and the first wiring are provided on the same plane and comprise the same metal element.

5. The display device according to claim 1,
   wherein the connection terminal comprises part of the first wiring.

6. The display device according to claim 1, further comprising:
   an FPC electrically connected to the connection terminal,
   wherein the FPC comprises a portion covering the exposed end surface of the second wiring.

7. The display device according to claim 1,
   wherein the substrate comprises a first portion overlapping with the first wiring and a second portion overlapping with the connection terminal and the second wiring,
   wherein the first portion is bent so that the first wiring is on an outer side, and
   wherein the second portion comprises a region overlapping with the first wiring or the display portion.

8. A display device comprising a substrate, a display portion, a connection terminal, a first wiring, and a second wiring,
   wherein the first wiring is electrically connected to the connection terminal and comprises a portion positioned between the connection terminal and the display portion,
   wherein the second wiring is electrically connected to the connection terminal, is positioned between the connection terminal and an end portion of the substrate, and comprises a portion in which an end a cidc surface is exposed at the end portion of the substrate,
   wherein the display portion comprises a transistor,
   wherein the transistor comprises a semiconductor layer, a gate insulating layer, and a gate electrode, and
   wherein the semiconductor layer and the second wiring are formed by processing the same oxide semiconductor film,
   wherein the semiconductor layer comprises a first region overlapping with the gate electrode and a second region not overlapping with the gate electrode, and
   wherein the second region and the second wiring have lower resistances than the first region.

9. The display device according to claim 8,
   wherein the semiconductor layer and the second wiring are provided on the same plane.

10. The display device according to claim 8,
    wherein the second wiring has a higher resistance than the first wiring.

11. The display device according to claim 8, further comprising:
    a third wiring electrically connected to the transistor,
    wherein the third wiring and the first wiring are provided on the same plane and comprise the same metal element.

12. The display device according to claim 8,
    wherein the connection terminal comprises part of the first wiring.

13. The display device according to claim 8, further comprising:
    an FPC electrically connected to the connection terminal,
    wherein the FPC comprises a portion covering the exposed end surface of the second wiring.

14. The display device according to claim 8,
  wherein the substrate comprises a first portion overlapping with the first wiring and a second portion overlapping with the connection terminal and the second wiring,
  wherein the first portion is bent so that the first wiring is on an outer side, and
  wherein the second portion comprises a region overlapping with the first wiring or the display portion.

15. A method for manufacturing a display device comprising:
  forming a transistor comprising a semiconductor layer, a plurality of connection terminals, and a wiring electrically connecting the plurality of connection terminals over a substrate;
  cutting part of the substrate and part of the wiring to isolate the plurality of connection terminals electrically; and
  connecting an FPC to the plurality of connection terminals,
  wherein the semiconductor layer and the wiring are formed by processing the same metal oxide film,
  wherein the semiconductor layer comprises a first region overlapping with the gate electrode and a second region not overlapping with the gate electrode, and
  wherein the second region and the second wiring have lower resistances than the first region.

* * * * *